US008049527B2

(12) United States Patent
Lee

(10) Patent No.: US 8,049,527 B2
(45) Date of Patent: Nov. 1, 2011

(54) PROCESS, VOLTAGE, AND TEMPERATURE SENSOR

(75) Inventor: Jung Hee Lee, Woburn, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/843,955

(22) Filed: Jul. 27, 2010

(65) Prior Publication Data

US 2011/0029266 A1 Feb. 3, 2011

Related U.S. Application Data

(63) Continuation of application No. PCT/US2009/057823, filed on Sep. 22, 2009.

(60) Provisional application No. 61/229,056, filed on Jul. 28, 2009.

(51) Int. Cl.
*G01R 31/02* (2006.01)
*G01R 31/00* (2006.01)

(52) U.S. Cl. .................. 324/762.01; 324/750.3

(58) Field of Classification Search .................. None
See application file for complete search history.

(56) References Cited

U.S. PATENT DOCUMENTS

| 4,528,505 | A | 7/1985 | Peterson |
| 6,049,252 | A | 4/2000 | Iwata |
| 6,278,325 | B1 | 8/2001 | Juang |
| 6,486,711 | B1 | 11/2002 | Tsay et al. |
| 6,566,900 | B2 * | 5/2003 | Amick et al. ............. 324/750.3 |
| 6,628,135 | B2 | 9/2003 | Gauthier et al. |
| 6,847,904 | B2 | 1/2005 | Blake et al. |
| 6,862,438 | B2 | 3/2005 | Darabi |
| 6,958,648 | B2 | 10/2005 | Cheung et al. |
| 7,026,875 | B2 | 4/2006 | Sobel |
| 7,098,738 | B2 | 8/2006 | Tam et al. |
| 7,108,211 | B2 | 9/2006 | Ramun |
| 7,127,368 | B2 | 10/2006 | Choi |
| 7,135,909 | B1 | 11/2006 | Willis |
| 7,171,327 | B2 | 1/2007 | Kim |
| 7,180,211 | B2 | 2/2007 | Sinha et al. |
| 7,204,638 | B2 | 4/2007 | Hsu |
| 7,215,202 | B2 | 5/2007 | Al-Shyoukh et al. |
| 7,276,962 | B1 | 10/2007 | Tomasi |
| 7,309,998 | B2 * | 12/2007 | Burns et al. ............. 324/762.01 |
| 7,312,648 | B2 | 12/2007 | Yang |
| 7,368,973 | B2 | 5/2008 | Sato |
| 7,369,816 | B2 | 5/2008 | Kappes et al. |
| 7,375,540 | B2 * | 5/2008 | Burns et al. ............. 324/750.3 |
| 2003/0081484 | A1 | 5/2003 | Kobayashi et al. |
| 2005/0074051 | A1 | 4/2005 | Won et al. |

FOREIGN PATENT DOCUMENTS

| KR | 10-1999-0048860 A | 7/1999 |
| KR | 10-2005-0033123 A | 5/2005 |
| KR | 10-2006-0118733 A | 11/2006 |

* cited by examiner

*Primary Examiner* — Vinh Nguyen
(74) *Attorney, Agent, or Firm* — Lando & Anastasi, LLP

(57) ABSTRACT

An integrated circuit includes a process sensor, a temperature sensor, and a voltage sensor. The process sensor is configured to sense a process parameter indicative of a semiconductor process by which the integrated circuit is formed and, based upon the sensed process parameter, to provide a characterization of the semiconductor process to the output of the process sensor. The temperature sensor is configured to provide an indication of a temperature of the integrated circuit to an output of the temperature sensor and the voltage sensor is configured to provide an indication of a power supply voltage level of the integrated circuit to an output of the voltage sensor. The output of the process sensor is coupled to at least one of the temperature sensor and the voltage sensor to compensate at least one of the indication of the temperature and the indication of the power supply voltage level.

11 Claims, 15 Drawing Sheets

| | gain = 32 (111011) | | |
|---|---|---|---|
| tem | slow=1, nom=0, fast=0 | slow=0, nom=1, fast=0 | slow=0, nom=0, fast=1 |
| 11001 | 12, 20 | 17, 18 | 15, 19 |
| 11000 | 10, 20 | 15, 18 | 13, 19 |
| 10111 | 16, 19 | 13, 18 | 11, 19 |
| 10110 | 14, 19 | 12, 18 | 10, 19 |
| 10101 | 13, 19 | 10, 18 | 16, 18 |
| 10100 | 12, 19 | 17, 17 | 14, 18 |
| 10011 | 17, 18 | 15, 17 | 13, 18 |
| 10010 | 15, 18 | 13, 17 | 12, 18 |
| 10001 | 13, 18 | 12, 17 | 10, 18 |
| 10000 | 12, 18 | 10, 17 | 15, 17 |
| 01111 | 10, 18 | 15, 16 | 14, 17 |
| 01110 | 17, 17 | 14, 16 | 19, 16 |
| 01101 | 15, 17 | 12, 16 | 18, 16 |
| 01100 | 13, 17 | 10, 16 | 16, 16 |

Figure 9

PROCESS, VOLTAGE, AND TEMPERATURE SENSOR

CROSS REFERENCE TO RELATED APPLICATIONS

This application is a continuation of, and claims priority under 35 U.S.C. §120 to Patent Cooperation Treaty Application Ser. No. PCT/US09/57823, entitled "PROCESS, VOLTAGE, AND TEMPERATURE SENSOR" filed on Sep. 22, 2009, which claims priority under 35 U.S.C. §119(e) to U.S. Provisional Application Ser. No. 61/229,056 entitled "PROCESS, VOLTAGE, AND TEMPERATURE SENSOR" filed on Jul. 28, 2009, each of which is incorporated by reference herein in its entirety.

BACKGROUND OF INVENTION

1. Field of Invention

The present invention relates generally to semiconductor devices, and more particularly, to a sensor capable of monitoring operational parameters of a semiconductor device.

2. Discussion of Related Art

The performance of semiconductor devices can vary dependent upon the conditions under which the device is used. For example, performance characteristics, such as rise time, fall time, gain, bandwidth, linearity, frequency response, etc. of a semiconductor device will typically vary dependent upon the power supply voltage level at which the device is used and the temperature of the device. However, even where two devices of the same type are manufactured using the same fabrication equipment and operated under identical conditions, one device may still perform differently than the other. Such differences in performance typically arise because despite the fact that the same fabrication equipment and processing steps are used to form the device, minute differences in the process by which each individual device is formed can still occur. Such differences in the process by which an individual device is formed are typically more pronounced between devices formed on different semiconductor wafers, or between devices formed on different wafers and at different times (i.e., in different batches), but differences can even occur between devices formed on the same wafer (for example where a first device is located at an edge of the wafer and the other in a more central location). Because of these slight differences in the process by which an individual device is formed, the performance of one device may vary from that of another.

In many applications, such slight variations in the process by which a device is formed and any resulting differences in performance may be of little concern, or can be tolerated by the design of the electronic circuit or apparatus in which the device is used. However, in some applications, such differences in performance between devices of the same type may impact the operation of the electronic circuit or apparatus in which the device is used.

SUMMARY OF INVENTION

Applicants have appreciated that certain semiconductor devices are sensitive to temperature, supply voltage level, and the process by which the device was formed. Such sensitivity may be problematic when it is desired that semiconductor devices of the same design and manufacture perform consistently. Accordingly Applicants have developed a sensor that is capable of sensing the voltage level and the temperature at which a device is operated, and sensing parameters indicative of the process by which the device was produced to characterize the performance of the device. This information may then be used to compensate the device to ensure more consistent performance between different devices of the same design and manufacture, irrespective of performance differences between the devices, differences in the temperature or supply voltage at which the devices are operated, or all of the above.

In accordance with one aspect of the present invention, an integrated circuit is provided. The integrated circuit comprises a process sensor, a temperature sensor, and a voltage sensor. The process sensor is configured to sense a process parameter indicative of a semiconductor process by which the integrated circuit is formed and, based upon the sensed process parameter, to provide a characterization of the semiconductor process to an output of the process sensor. The temperature sensor is configured to provide an indication of a temperature of the integrated circuit to an output of the temperature sensor. The voltage sensor is configured to provide an indication of a power supply voltage level of the integrated circuit to an output of the voltage sensor. The output of the process sensor is electrically coupled to at least one of the temperature sensor and the voltage sensor to compensate at least one of the indication of the temperature and the indication of the power supply voltage level in response to the characterization of the semiconductor process.

In accordance with one embodiment, the output of the process sensor is electrically coupled to both the temperature sensor and the voltage sensor to compensate both the indication of the temperature and the indication of the power supply voltage level in response to the characterization of the semiconductor process.

In accordance with another embodiment, the process sensor provides the characterization of the semiconductor process each time the process sensor is powered on. In a further embodiment, the temperature sensor is configured to dynamically provide the indication of the temperature of the integrated circuit to the output of the temperature sensor, and the voltage sensor is configured to dynamically provide the indication of the power supply voltage level of the integrated circuit to the output of the voltage sensor.

In accordance with another embodiment, the integrated circuit includes an associated semiconductor device that is commonly formed with the process sensor, the temperature sensor, and the voltage sensor using the same semiconductor process fabrication steps. In accordance with one embodiment, the associated semiconductor device is programmable. In a further embodiment, the associated semiconductor device is compensated in response to the characterization of the semiconductor process provided by the process sensor, the indication of the temperature provided by the temperature sensor, and the indication of the power supply voltage level provided by the voltage sensor.

In accordance with another embodiment, the integrated circuit further comprises an algorithmic state machine. The algorithmic state machine is electrically coupled to the output of the process sensor, the output of the temperature sensor, the output of the voltage sensor, and a programmable input of the associated semiconductor device. The algorithmic state machine is configured to compensate the associated semiconductor device in response to the characterization of the semiconductor process provided by the process sensor, the indication of the temperature provided by the temperature sensor, and the indication of the power supply voltage level provided by the voltage sensor. In a further embodiment, the associated semiconductor device includes a programmable gain amplifier and the algorithmic state machine includes an input to receive an operational setting indicative of at least one of a gain and a frequency response of the programmable gain amplifier. The algorithmic state machine is configured to compensate the programmable gain amplifier in response to the characterization of the semiconductor process provided by the process sensor, the indication of the temperature provided by the temperature sensor, and the indication of the power supply voltage level provided by the voltage sensor according to the operational setting.

In accordance with another embodiment, the integrated circuit further comprises at least one interface electrically coupled to the output of the process sensor, the output of the temperature sensor, the output of the voltage sensor, and a programmable input of the associated semiconductor device. The interface is configured to provide the characterization of the semiconductor process provided by the process sensor, the indication of the temperature provided by the temperature sensor, and the indication of the power supply voltage level provided by the voltage sensor to an external device, and to receive from the external device a compensated operational setting to provide to the programmable input of the associated semiconductor device.

In accordance with another embodiment, the associated semiconductor device has an output to provide an output signal. The integrated circuit further comprises at least one interface electrically coupled to the output of the process sensor, the output of the temperature sensor, and the output of the voltage sensor. The at least one interface is configured to provide the characterization of the semiconductor process provided by the process sensor, the indication of the temperature provided by the temperature sensor, and the indication of the power supply voltage level provided by the voltage sensor to an external device to allow the external device to compensate the output signal of the associated semiconductor device based upon the characterization of the semiconductor process, the indication of the temperature, and the indication of the power supply voltage level.

In accordance with another aspect of the present invention, a method of monitoring a semiconductor device formed in accordance with a semiconductor process is provided. The method comprises acts of sensing a process parameter indicative of the semiconductor process by which the semiconductor device is formed and characterizing the semiconductor process based upon the sensed process parameter. The method further comprises sensing a temperature of the semiconductor device, sensing a power supply voltage level being provided to the semiconductor device, and compensating at least one of the sensed temperature of the semiconductor device and the sensed power supply voltage level being provided to the semiconductor device responsive to the act of characterizing.

In accordance with one embodiment, the act of compensating includes an act of compensating both the sensed temperature of the semiconductor device and the sensed power supply voltage level being provided to the semiconductor device responsive to the act of characterizing. In accordance with another embodiment, the acts of sensing the process parameter, sensing the temperature, sensing the power supply voltage level being provided to the semiconductor device, and compensating both the sensed temperature of the semiconductor device and the sensed power supply voltage level being provided to the semiconductor device are performed dynamically responsive to the act of characterizing.

In accordance with another embodiment, the act of characterizing the semiconductor process includes an act of characterizing the semiconductor process as one of fast, nominal, and slow.

In accordance with another embodiment, the semiconductor device is a programmable semiconductor device and the method further comprises an act of adjusting at least one programmable parameter of the semiconductor device in response to the compensated sensed temperature, the compensated sensed power supply voltage level, and the characterized semiconductor process. In a further embodiment, the act of adjusting includes acts of receiving an operational setting for the programmable semiconductor device, indexing the operational setting with the compensated sensed temperature, the compensated sensed power supply voltage level, and the characterized semiconductor process to determine a compensated operational setting, and providing the compensated operational setting to the programmable semiconductor device to adjust the at least one programmable parameter. In a further embodiment, the acts of receiving, indexing, and providing are performed on a same integrated circuit as the programmable semiconductor device. In an alternative embodiment, the acts of receiving and indexing are performed by a processor located on a different integrated circuit than the programmable semiconductor device.

In accordance with another aspect of the present invention, a semiconductor process sensor to characterize a semiconductor process by which the semiconductor process sensor was formed is provided. The semiconductor process sensor comprises a constant reference voltage source, a process sensing resistor, a constant current source, and an analog-to-digital converter. The constant reference voltage source has an output to provide a constant reference voltage signal. The process sensing resistor has a first terminal electrically coupled to the output of the constant reference voltage source and a second terminal to provide a sensed voltage signal, the process sensing resistor having a resistance that is dependent on at least one variation in the semiconductor process used to form the semiconductor process sensor. The constant current source is electrically coupled to the second terminal of the process sensing resistor. The analog-to-digital converter is coupled to the second terminal of the process sensing resistor to provide at least one output signal characterizing the semiconductor process by which the semiconductor process sensor was formed.

In accordance with one embodiment, the process sensor further comprises a voltage divider having an input electrically coupled to the output of the constant reference voltage source and an output. The voltage divider includes a plurality of resistors serially connected between the input of the voltage divider and the output of the voltage divider. The analog-to-digital converter is additionally coupled to the voltage divider, wherein the voltage divider provides at least one voltage to the analog-to-digital converter as a reference voltage signal. In a further aspect of this embodiment, each of the resistors of the voltage divider has substantially the same height, width, and length, and the process sensing resistor has a height and width. The height of the process sensing resistor is approximately the same as the height of each of the resistors of the voltage divider and the width of the process sensing resistor is substantially less than the width of each of the resistors of the voltage divider.

In accordance with another embodiment, the process sensor further comprises a voltage divider having an input electrically coupled to the output of the constant reference voltage source and an output. The voltage divider provides a plurality of different reference voltage signals. The analog-to-digital converter comprises at least one comparator having a first input electrically coupled to the voltage divider to receive a first reference voltage signal of the plurality of different reference voltage signals, a second input electrically coupled to the voltage divider to receive a second reference voltage signal of the plurality of different voltage signals, and a third input electrically coupled to the second terminal of the process sensing resistor to receive the sensed voltage signal. The at least one comparator is configured to compare the sensed voltage signal with the first and second voltage reference signals and provide at least one comparator output signal, the at least one comparator output signal being the at least one output signal characterizing the semiconductor process by which the semiconductor process sensor was formed.

In accordance with a further aspect of this embodiment, the voltage divider includes a plurality of series resistors electrically connected between the input and the output of the voltage divider. The plurality of series resistors includes a first resistor, a second resistor, a third resistor, and a fourth resistor. The first resistor has a first terminal and a second terminal, the first terminal of the first resistor being electrically coupled to the input of the voltage divider and the first terminal of the process sensing resistor, and the second terminal of the first resistor being electrically coupled to the first input of the at least one comparator. The second resistor has a first terminal and a second terminal, the first terminal of the second resistor being electrically coupled to the second terminal of the first resistor. The third resistor has a first terminal and a second terminal, the first terminal of the third resistor being electrically coupled to the second terminal of the second resistor, and the second terminal of the third resistor being electrically coupled to the second input of the at least one comparator. The fourth resistor has a first terminal and a second terminal, the first terminal of the fourth resistor being electrically coupled to the second terminal of the third resistor, and the second terminal of the fourth resistor being electrically coupled to the output of the voltage divider. In a further aspect of this embodiment, the second terminal of the second resistor is electrically coupled to an input of the constant reference voltage source.

In accordance with another embodiment, the at least one comparator includes a first comparator and a second comparator. The first comparator has a first input to receive the first reference voltage signal and a second input to receive the sensed voltage signal. The first comparator is configured to compare the sensed voltage signal with the first reference voltage signal and to provide a first comparator output signal in response to the sensed voltage signal being greater than the first reference voltage signal, and to provide a second comparator output signal in response to the sensed voltage signal being less than the first reference voltage signal. The second comparator has a first input to receive the second reference voltage signal and a second input to receive the sensed voltage signal. The second comparator is configured to compare the sensed voltage signal with the second reference voltage signal and to provide a third comparator output signal in response to the sensed voltage signal being greater than the second reference voltage signal, and to provide a fourth comparator output signal in response to the sensed voltage signal being less than the second reference voltage signal.

In accordance with another embodiment, the semiconductor process sensor further comprises an encoder. The encoder has a first input to receive the first comparator output signal, a second input to receive the second comparator output signal, a third input to receive the third comparator output signal, and a fourth input to receive the fourth comparator output signal. The encoder is configured to assert a first output signal in response to the sensed voltage signal being greater than the first reference voltage signal, to assert a second output signal in response to the sensed voltage signal being less than the first reference voltage signal and greater than the second reference voltage signal, and to assert a third output signal in response to the sensed voltage signal being less than the second reference voltage signal. In accordance with a further aspect of this embodiment, the semiconductor process is characterized as fast in response to assertion of the first output signal by the encoder, the semiconductor process is characterized as nominal in response to assertion of the second output signal by the encoder, and the semiconductor process is characterized as slow in response to assertion of the third output signal by the encoder.

In accordance with another aspect of the present invention, a method of characterizing a semiconductor process by which a semiconductor process sensor is formed is provided. The method comprises acts of providing a substantially constant reference voltage to a voltage divider and a process sensing resistor, generating, in the voltage divider, a plurality of different reference voltages based upon the substantially constant reference voltage, and determining a sensed voltage dropped across the process sensing resistor based upon the substantially constant reference voltage, a resistance of the process sensing resistor being dependent on at least one variation in the semiconductor process used to form the semiconductor process sensor. The method further comprises comparing the plurality of different reference voltages with the sensed voltage, and characterizing, based on the act of comparing, the semiconductor process by which the semiconductor process sensor was formed.

In accordance with one embodiment, the act of generating includes an act of generating a first reference voltage and a second reference voltage, and the act of comparing includes an act of comparing the sensed voltage with the first reference voltage and the second reference voltage. In a further embodiment, the act of characterizing includes acts of characterizing the semiconductor process as fast in response to the sensed voltage being greater than the first reference voltage, characterizing the semiconductor process as nominal in response to the sensed voltage being less than the first reference voltage and greater than the second reference voltage, and characterizing the semiconductor process as slow in response to the sensed voltage being less than the second reference voltage. In yet a still further embodiment, the method further comprises asserting a first output signal in response to the semiconductor process being characterized as fast, asserting a second output signal in response to the semiconductor process being characterized as nominal, and asserting a third output signal in response to the semiconductor process being characterized as slow.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 9 illustrates a portion of a lookup table according to an embodiment of the present invention;

DETAILED DESCRIPTION

Figure 1:
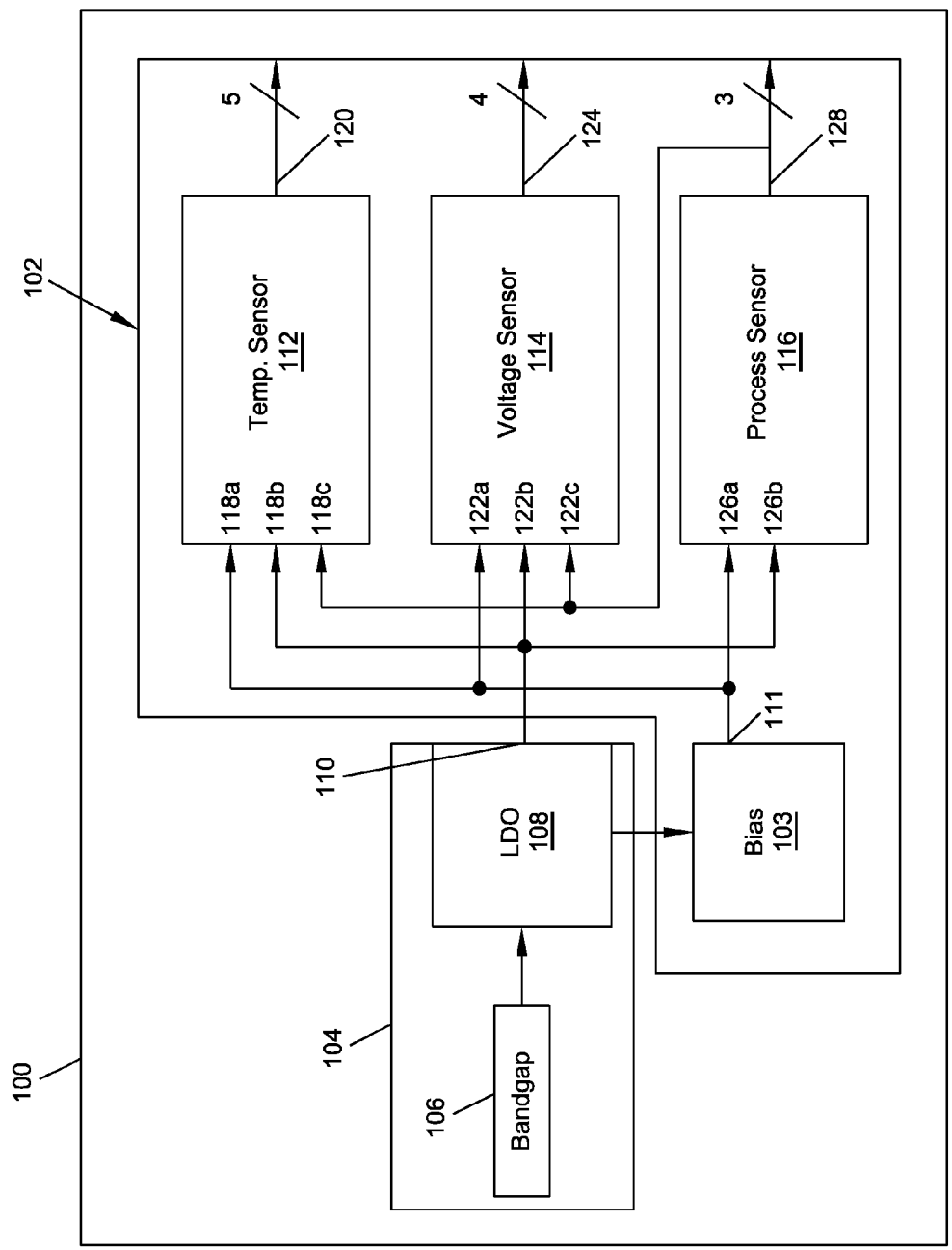
FIG. 1 is a block diagram of a process, voltage and temperature (PVT) sensor according to an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In many semiconductor device applications, it is beneficial for a semiconductor device to provide a consistent output signal. For example, in Cable Television (CATV) systems, an upstream Programmable Gain Amplifier (PGA) that provides and maintains a consistent output signal (in terms of performance characteristics such as DC gain, gain bandwidth, gain flatness, frequency compensation, linearity, etc.) may be desired to ensure that downstream components operate properly or efficiently. In such applications, it may further be desired to provide a consistent output signal across distinct devices of the same design and manufacture. Although individual devices may be tested to determine performance characteristics, and then sorted to provide an end user with distinct devices having similar performance characteristics, such testing and sorting typically increases the device cost. Further, such testing fails to address differences in the environment in which the device is used, such that differences in the supply voltage level and/or the temperature at which the device is operated may still result in one device performing differently than another.

Embodiments of the present invention are directed to a Process, Voltage and Temperature (PVT) sensor configured to sense process parameters indicative of the process by which PVT sensor was produced, the power supply voltage level at which the PVT sensor is operated, and the temperature at which the PVT is operated. The PVT sensor is preferably implemented on the same integrated circuit as an associated device and formed by the same processing steps as the associated device, such that the parameters sensed by the PVT sensor accurately reflect those of the associated device. However, the PVT sensor and the associated device may be implemented on separate integrated circuits. Where the PVT sensor and the associated device are implemented on separate integrated circuits, the PVT sensor may still be used to sense parameters that accurately reflect those of the associated device. For example, where the PVT sensor is disposed in close proximity to the associated device, or mounted on a common substrate with the associated device, and the supply voltage to each is provided by the same power supply, the voltage and temperature parameters sensed by the PVT sensor will accurately reflect those of the associated device.

In accordance with one embodiment in which the PVT sensor and associated device are formed on the same integrated circuit and formed by the same processing steps, the sensed process parameters indicative of the process by which the associated device was produced are used to qualitatively characterize the performance of the associated device, and output signals related to the performance of the associated device, the sensed operating power supply voltage level of the associated device, and the sensed operating temperature of the associated device are provided. These output signals may be used to configure the associated device to compensate the associated device to provide a more consistent output, despite performance differences between different chips of the same design and manufacture, and despite differences in the conditions in which the device is operated. In one embodiment, at least a portion of the associated device is programmable and the portion is programmed in response to the output signals to compensate the associated device to provide a consistent output. In another embodiment, a device downstream from the associated device is configured in response to the output signals to compensate for performance differences in the associated device.

Referring to FIG. 1, there is shown a block diagram of a circuit 100, configured to be coupled (e.g., physically, electrically, or both) to an associated semiconductor device (not shown), including a PVT sensor 102 in accordance with an embodiment of the present invention. The PVT sensor 102 is coupled to a voltage reference circuit 104. As will be discussed in more detail below, the voltage reference circuit 104 includes a bandgap voltage reference source 106 coupled to a general Low-Dropout (LDO) regulator 108. The PVT sensor 102 includes a temperature sensor 112, a voltage sensor 114, a process sensor 116 and a bias circuit 103. The process sensor 116 has a plurality of inputs including an input 126a coupled to an output 111 of the bias circuit 103 and an input 126b coupled to an output 110 of the voltage reference circuit 104. The temperature sensor 112 has a plurality of inputs including an input 118a coupled to the output 111 of the bias circuit 103, an input 118b coupled to the output 110 of the voltage reference circuit 104, and an input 118c coupled to an output 128 of the process sensor 116. The voltage sensor 114 has a plurality of inputs including an input 122a coupled to the output 111 of the bias circuit 103, an input 122b coupled to the output 110 of the voltage reference circuit 104, and an input 122c coupled to the output 128 of the process sensor 116. As illustrated in FIG. 1, the bias circuit 103 is included within the PVT sensor 102; however, in another embodiment, the bias circuit 103 may not be included within the PVT sensor 102.

The voltage reference circuit 104 provides multiple stable reference voltages to the temperature sensor 112, the voltage sensor 114 and the process sensor 116. A conventional bandgap reference 106 operates as a reference for a conventional LDO voltage regulator 108 such that outputs from the voltage reference circuit 104 are stable with temperature and power supply voltage, for example, 3.3 volts. The bias circuit 103, responsive to the voltage reference circuit 104, provides multiple stable bias currents and voltages to the temperature sensor 112, the voltage sensor 114 and the process sensor 116. It is understood that the voltage reference circuit and the bias circuit 103 may be integrated with the PVT sensor 102 or separate therefrom. For simplicity, some of the connection details between the bias circuit 103 and the sensors 112-116 are not shown in later figures.

As will be explained in more detail below in conjunction with FIGS. 2 and 3, the process sensor 116 is configured to sense process parameters indicative of the process by which the PVT sensor (and an associated, commonly formed semiconductor device) was manufactured and to provide a characterization of that process to the output 128. In one embodiment, the characterization of the process is a three-bit number having one of three values indicating the "speed" of the process, i.e., the relative performance of transistors and other co-formed devices with respect to a nominal design performance value for a given manufacturing process, e.g., transistor gain, polysilicon conductivity, implant doses, etc. For example, a first bit is set high and the other two bits are set low if the process speed is determined to be slow compared to nominal (referred to herein as a "slow" process). A second bit is set high and the other two bits are set low if the process speed is determined to be nominal (referred to herein as a "nominal" process). A third bit is set high and the other two bits are set low if the process speed is determined to be fast (referred to herein as a "fast" process). It should be appreciated that in other embodiments, the process characterization may include any number of bits or values, may be encoded differently, and may be indicative of a process parameter other then speed, e.g., capacitance.

Figure 4:
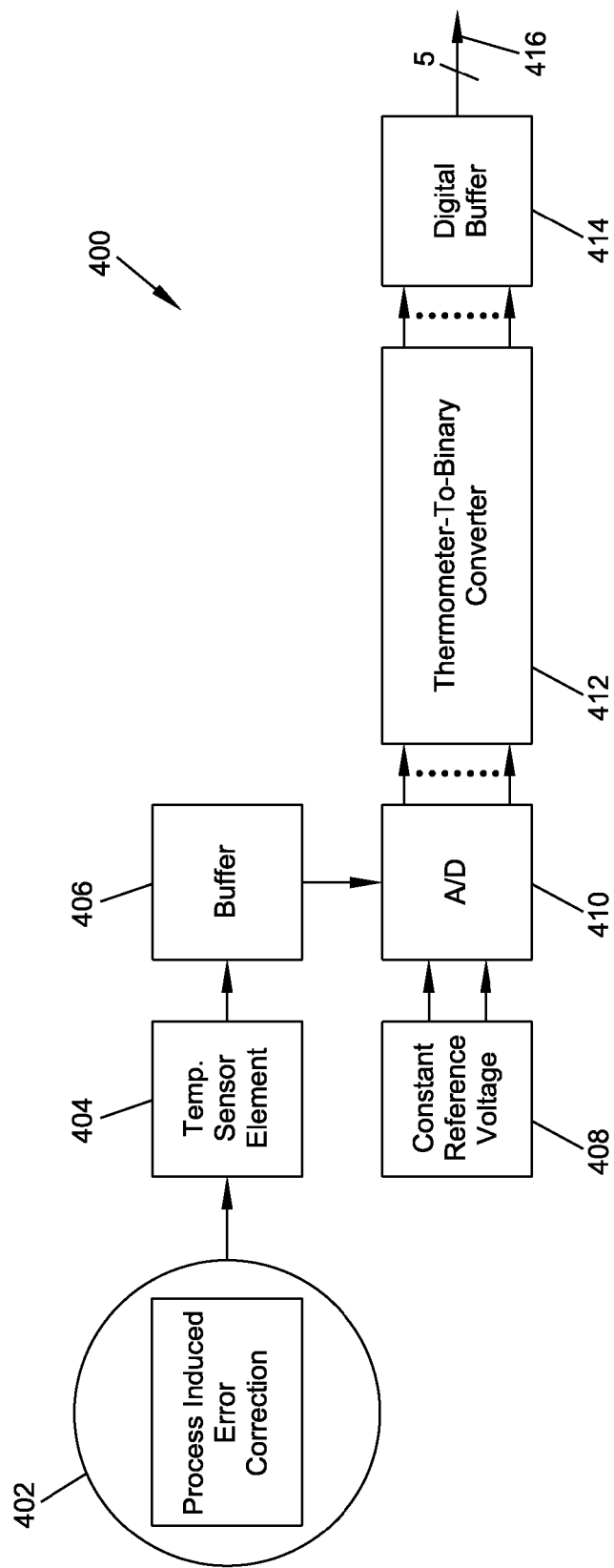
FIG. 4 is a block diagram of a temperature sensor useful in the PVT sensor for FIG. 1.
Figure 4A:
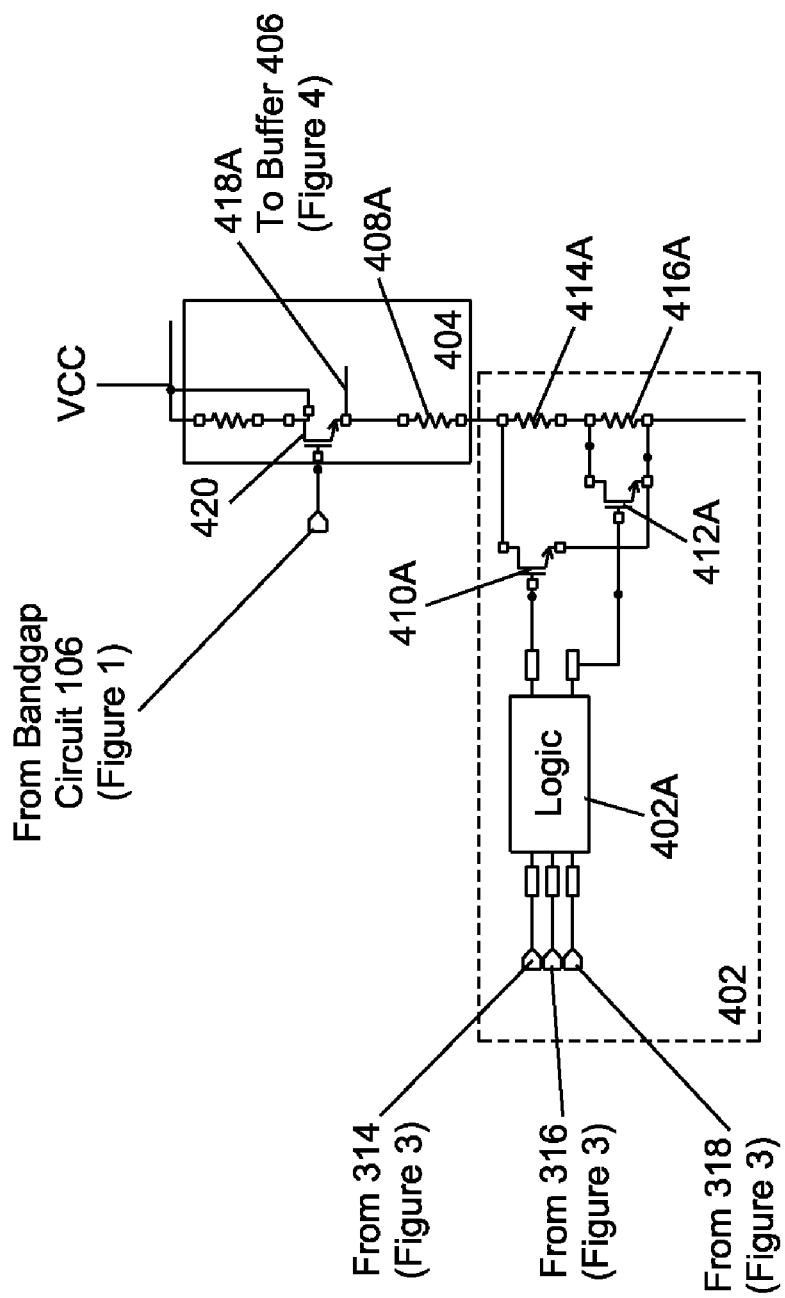
FIG. 4A is a more detailed schematic diagram of a portion of the temperature sensor of FIG. 4.

As will be explained in more detail below in conjunction with FIGS. 4 and 4A, the temperature sensor 112 is configured to sense the die temperature of the PVT sensor (and the associated, commonly formed semiconductor device) and to provide an indication of the die temperature of the PVT sensor and the associated semiconductor device to the output 120. In one embodiment, the indication of temperature includes five bits representing a temperature range of −40° C. to 85° C. The five bits (ranging from 00000 to 11111) represent 32 different subdivisions of the temperature range over which the indication of the die temperature of the PVT sensor (and the associated, commonly formed semiconductor device) may be operated. It should be appreciated that the indication of die temperature may include any number of bits, may represent any temperature range and may be subdivided into any number of smaller (or larger) steps. For example, in another embodiment, the indication of temperature may include six bits representing a temperature range of −20° C. to 65° C. The six bits (ranging from 000000 to 111111) could represent 64 different subdivisions of the temperature range. It should be appreciated that the subdivisions can, but need not be, uniform.

Figure 5:
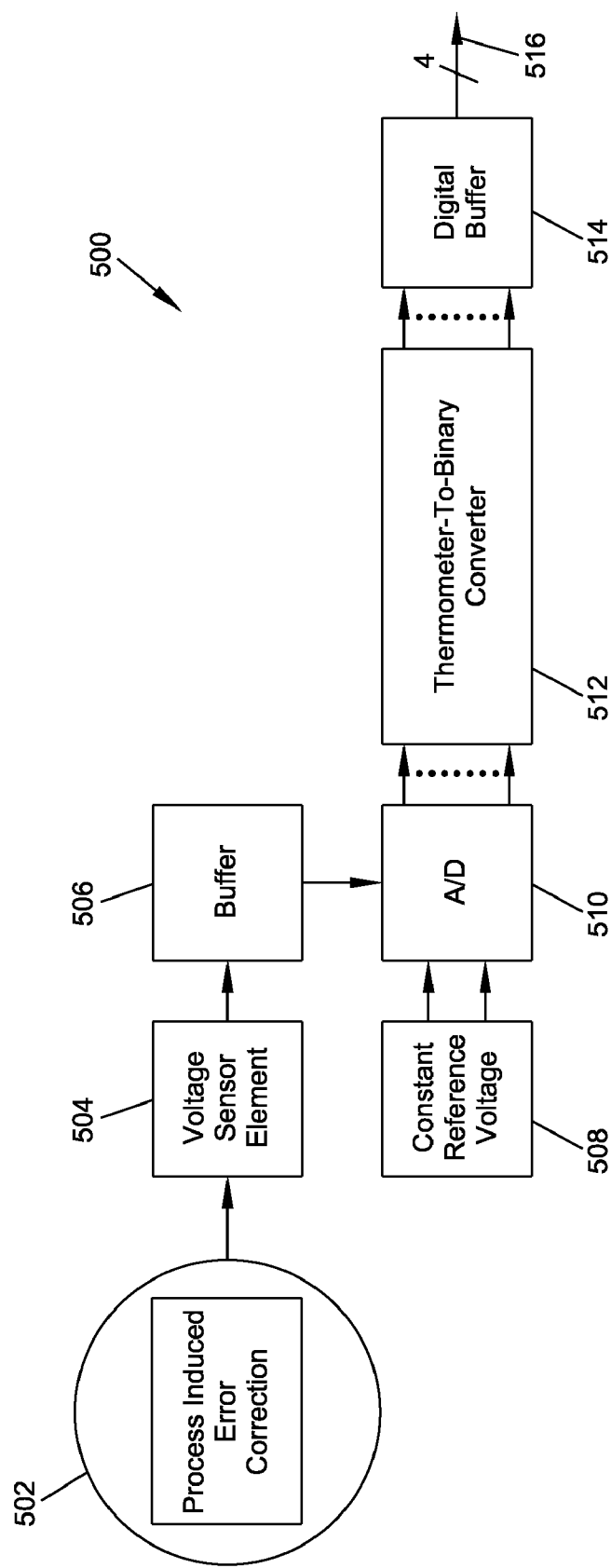
FIG. 5 is a block diagram of a voltage sensor useful in the PVT sensor of FIG. 1.

As will be explained in more detail below in conjunction with FIGS. 5 and 5A, the voltage sensor 114 is configured to sense the voltage of the power supply (not shown) of the PVT sensor (and the associated, commonly formed semiconductor device) and to provide an indication of the power supply voltage level to the output 124. In one embodiment, the indication of the power supply voltage level includes four bits representing a voltage range of 4.5 volts to 5.5 volts. The four bits (0000 to 1111) represent 16 different subdivisions of the voltage range over which the indication of the power supply voltage level of the PVT sensor (and the associated, commonly formed semiconductor device) operates. It should be appreciated that the indication of the power supply voltage level may include any number of bits, may represent any voltage range and may be subdivided into any number of smaller (or larger) uniform or non-uniform steps. For example, in another embodiment, the indication of the power supply voltage level may include three bits representing a voltage range of 4.7 volts to 5.2 volts. The three bits (000 to 111) could represent eight different subdivisions of the voltage range.

Further details of the process sensor 116, according to an embodiment of the present invention, are now described with reference to FIG. 2. The process sensor 200 includes a constant reference voltage source 202 corresponding to the voltage reference circuit 104 (FIG. 1), a process sensor element 204 coupled to the constant reference voltage source 202, an encoder 206 coupled to the process sensor element 204, and an optional digital buffer 208 coupled to the encoder 206, with the output of the digital buffer 208 forming an output 210 of the process sensor 200.

The constant reference voltage source 202 provides a constant reference voltage signal to the process sensor element 204. In one embodiment, the constant reference voltage source 202 is provided by the voltage reference circuit 104 of FIG. 1, but it should be understood that the constant voltage source 202 may be a separate, stabilized voltage reference source. The process sensor element 204 senses one or more parameters indicative of the process by which the sensor element (and the associated, commonly formed semiconductor device) was produced, characterizes that process, and outputs a digital signal indicative of that characterization. In the embodiment described below, the process sensor element 204 characterizes the speed into one of three levels: slow, nominal or fast.

It is to be appreciated that the speed of the PVT sensor and the associated, commonly formed semiconductor device may vary depending on the process by which these devices were manufactured. For example, in a 90 nm CMOS manufacturing process, variability in the manufacturing process generally results in some devices made using that process performing better (e.g., faster) than a design-nominal value, and some devices performing worse (e.g., slower) than the design-nominal value. These differences in performance generally result from variations in one or more process parameters, such as feature (transistor) sizes, dopant dosage variations, and even variations in the underlying wafer orientation and the dopants therein. Further, such variations in process parameters may affect certain elements of the device (e.g., PMOS transistors) more or less than other elements of the device (e.g., NMOS transistors). Accordingly, it should be appreciated that that the process sensor element 204 may be designed to divide the speeds into less than, or more than three levels, depending on potential process variations. For example, where one type of transistor (e.g., a PMOS transistor) operates differently than another type of transistor (e.g., an NMOS transistor), the performance may be transistor-type specific and characterized as fast/fast, fast/nominal, fast/slow, slow/fast, etc. As explained in more detail below with respect to FIG. 3, in one embodiment, the process sensor element 204 provides a process measurement output (fast, nominal, slow) that is based upon polysilicon resistor resistance variation, although other process sensing approaches and output characterizations are possible.

The encoder 206 encodes the signals from the process sensor element 204 into digital signals in which, in this example, only one of the three bits is asserted at a given time. The digital buffer 208 provides the digital signals to the output 210. For example, in one embodiment, a first bit is set high and the other two bits are set low if the process speed is determined to be slow. A second bit is set high and the other two bits are set low if the process speed is determined to be nominal. A third bit is set high and the other two bits are set low if the process speed is determined to be fast. It should be appreciated that in other embodiments, the process characterization may include any number of bits and may be encoded differently, depending on potential process variations.

Figure 2:
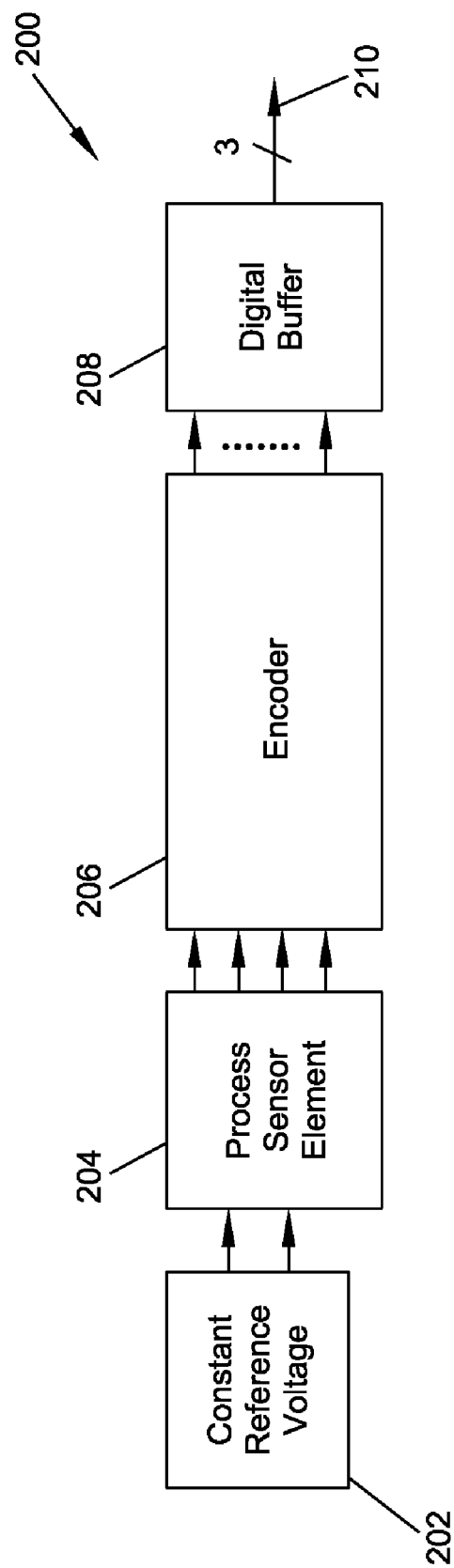
FIG. 2 is a block diagram of an exemplary process sensor useful in the PVT sensor of FIG. 1.
Figure 3:
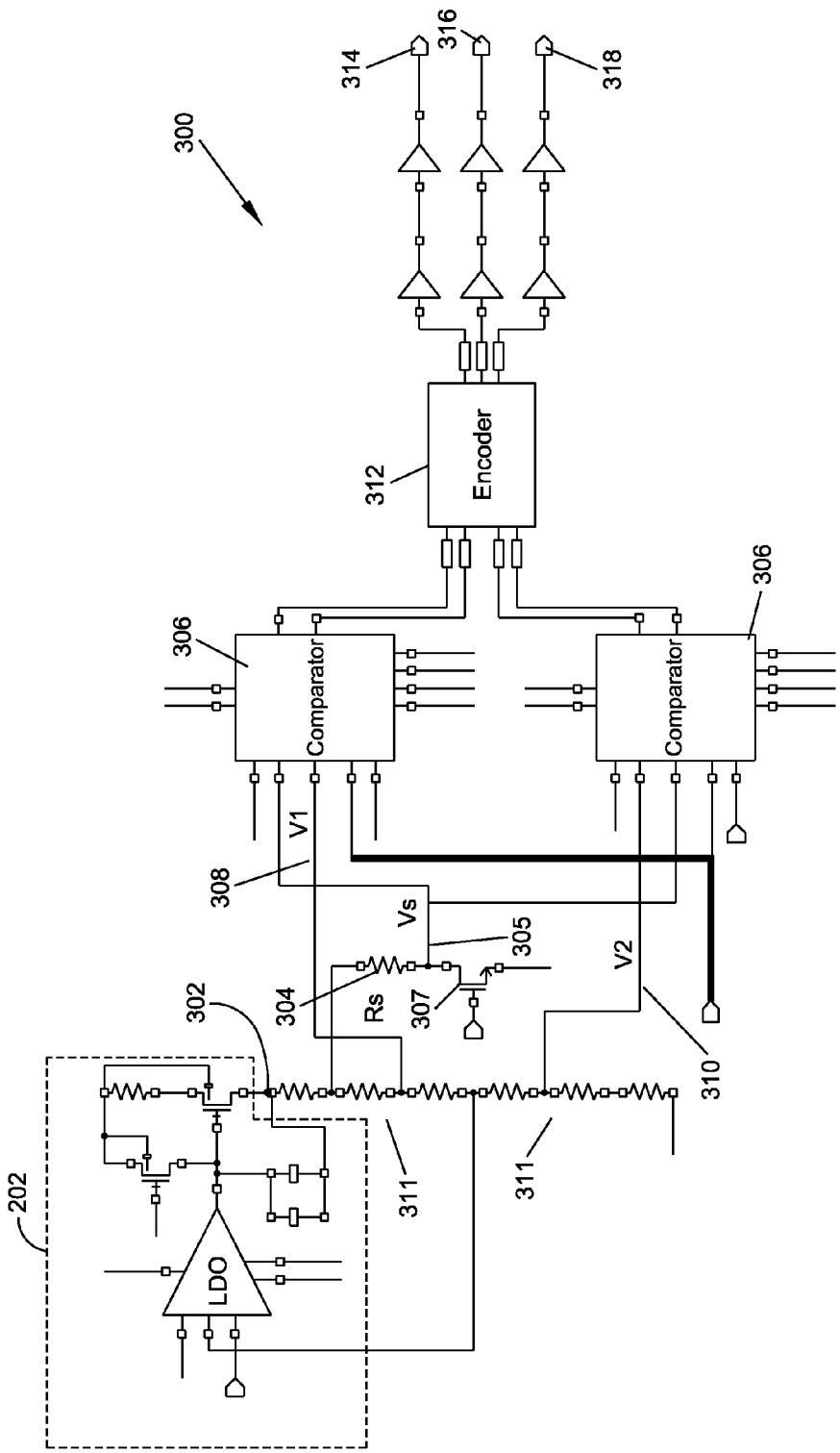
FIG. 3 is a more detailed schematic diagram of the process sensor of FIG. 2.

FIG. 3 shows a more detailed exemplary embodiment of the process sensor 200 of FIG. 2 according to one embodiment of the present invention. The process sensor 300 includes a constant reference voltage source 202, a voltage divider 311, a process sensing resistor Rs 304, a process sensing transistor 307, multiple comparators 306, an encoder 312, and a plurality of buffered outputs 314, 316, 318. Input 302, coupled to an output of the constant reference voltage source 202 (which may be the voltage reference circuit 104 of FIG. 1), receives a stabilized voltage therefrom and drives the voltage divider 311. The process sensing resistor Rs 304 and the process sensing transistor 307 are coupled to the voltage divider 311. The multiple comparators 306 are coupled to the voltage divider 311, the process-sensing resistor Rs 304 and the process-sensing transistor 307. The encoder 312 is coupled to the comparators 306 and the plurality of outputs 314, 316, 318.

In the example shown, the process-sensing resistor Rs 304 receives a constant voltage from the input 302 via the voltage divider 311. The gate of the process-sensing transistor 307 receives a constant bias voltage from bias voltage source 103 (not shown in FIG. 3, but shown in FIG. 1) and operates as a constant current source. As will be explained in more detail below, the resistance of the process-sensing resistor Rs 304 is more sensitive to variations the manufacturing process used to fabricate the process sensor 300 than the resistors of the voltage dividers 311. As a result, the voltage Vs 305 produced by the process-sensing resistor Rs 304 is dependent on the process used to produce the process sensor element. The comparators 306 monitor the voltages V1 308 and V2 310 from the voltage divider 311 along with the voltage Vs 305 and provide digital signals characterizing the process used to produce the process sensor element. The process used to produce the process sensor element is characterized in response to whether the voltage Vs 305 is found to be greater than V1 308, between V1 308 and V2 310, or less than V2 310. In one embodiment, the characterization of the process is indicative of the speed of the process used to form the process sensor element and therefore the speed of the process used to form the associated semiconductor device. The speed is characterized as slow when the voltage Vs 305 is less than the voltage V2 310, nominal when the voltage Vs 305 is between voltages V1 308 and V2 310, and fast when the voltage Vs 305 is greater than V1 308. The encoder 312 receives the digital signals from the comparators 306 and produces a three bit signal indicative of the speed of the process used to form the sensor element (and the associated, commonly formed semiconductor device) as discussed above, including a slow bit 314, a nominal bit 316 and a fast bit 318. It should be appreciated that in other embodiments, the process characterization may include any number of bits and may be encoded differently. It is also to be appreciated that the characterization of speed may be performed differently, such as with a ring oscillator or clock.

As is well known, the resistance of an integrated circuit resistor is related to the resistivity of the material used to make the resistor and the physical dimensions of the resistor. Further, the resistance of a resistor is proportional to the ratio of the length of the resistor to the cross-sectional area (height times width) of the resistor. Differences in the resistance of process-sensing resistor Rs 304, while not directly measuring the speed of a device, are a strong indicator of overall device performance. To make resistor 304 more sensitive to process variations than the resistors in the voltage divider, the cross-sectional area of the process-sensing resistor Rs 304 is significantly less than the cross-sectional area of the resistors in voltage divider 311. In this example, the process-sensing resistor Rs 304 and the resistors of voltage divider 311 are conventional polysilicon resistors and the heights of all of the resistors are substantially the same. The resistances of all of the resistors in the voltage divider 311 and the process-sensing resistor Rs 304 are approximately the same, (e.g., approximately 25K ohms for process-sensing resistor Rs 304 and approximately 27K ohms for the resistors in voltage divider 311), the widths of the resistors in divider 311 are about twice that in process-sensing resistor Rs 304, and the length of each of the resistors in divider 311 is a little more than about twice that of process-sensing resistor Rs 304. It should be understood that the cross-sectional area of the resistors may be other than 2:1 (e.g., 3:1), the heights of the resistors may be different from each other, and the resistance of the voltage divider resistors and the resistance of the process-sensing resistor Rs 304 may be different from each other. It should be further understood that techniques other than variation in resistance might be used to detect process variations (e.g., ring oscillator frequency).

It is to be appreciated that the process sensor 300 is substantially unaffected by power supply voltage level changes and temperature changes. This is a result of the stable reference voltage provided by the constant reference voltage source 202 and also because of the nature of the process characterization provided by the comparators 306. The comparators monitor the relationship between the voltage Vs 305 and voltages V1 308 and V2 310 (e.g. whether Vs 305 is greater than V1 308, between V1 308 and V2 310, or less than V2 310). Thus, because any impact from changes in temperature will affect all of the voltages V1, V2, and V3 substantially equally, the relationship between Vs 305 and V1 308 and V2 310 will remain substantially the same. As such the process sensor 300 remains unaffected by variations in the power supply voltage level and temperature.

Further details of the temperature sensor 112 of FIG. 1, according to an embodiment of the present invention, are now described with reference to FIG. 4. The temperature sensor 400 includes a process-induced error correction circuit 402, a temperature sensor element 404, a buffer 406, a constant reference voltage source 408, an analog-to-digital (A/D) converter 410, a thermometer-to-binary code converter 412, and an optional digital buffer 414 with the output of the digital buffer 414 forming an output 416 of the temperature sensor 400. The temperature sensor element 404 is coupled to the process-induced error correction circuit 402. The buffer 406 is coupled to the temperature sensor element 404. The analog-to-digital converter 410 is coupled to the buffer 406 and the constant reference voltage source 408. The thermometer-to-binary code converter 412 is coupled to the analog-to-digital converter 410. The digital buffer 414 is coupled to the thermometer-to-binary code converter 412.

The process-induced error correction circuit 402 receives the three-bit process characterization data from the process sensor 300 (FIG. 3) and operates to at least partially compensate the temperature sensor element 404 in response to the process characterization data in order to reduce the effects of process variations on the temperature sensor. As will be explained in more detail below, the temperature sensor element 404 detects the die temperature of the temperature sensor, and therefore of the associated semiconductor device, and provides a voltage signal, indicative of the temperature of the die, to the buffer 406. The buffer 406 is configured to buffer the temperature sensor element 404 from the analog-to-digital converter 410 to prevent the load of the analog-to-digital converter 410 from impacting the temperature sensor element 404. In one embodiment, the buffer 406 is an optional component of the temperature sensor 400. The constant reference voltage source 408, such as the voltage reference circuit 104 (FIG. 1), provides a constant reference voltage signal to the analog-to-digital converter 410. Alternatively, the constant reference voltage source 408 might include an LDO regulator separate from the LDO regulator 108 in FIG. 1. The analog-to-digital converter 410 compares the voltage signal from buffer 406 with the constant reference voltage signal and, based on the comparison, provides a thermometer-coded digital signal, indicative of the die temperature, to the thermometer-to-binary code converter 412. A conventional thermometer-to-binary code converter 412 converts the thermometer-coded digital signals into binary-coded digital signals having a smaller number of bits. Finally, the digital buffer 414 provides the binary coded digital signals, indicative of the die temperature of the associated semiconductor device, to the output 416. As discussed above, the digitized indication of die temperature is five bits.

Further details of the process-induced error correction circuit 402 and the temperature sensor element 404, according to an embodiment of the present invention, are now described with reference to FIG. 4A. The process-induced error correction circuit 402 includes a logic circuit 402A, a plurality of switches 410A, 412A and a plurality of resistors 414A, 416A. The logic circuit 402A is coupled to the plurality of outputs 314, 316, 318 from the process sensor 300 (FIG. 3). Each of the plurality of switches 410A, 412A is controlled by the output of the logic circuit 402A. Each of the plurality of resistors 414A, 416A is coupled to an output of the plurality of switches 410A, 412A.

The temperature sensor element 404 includes a temperature-stable temperature sense resistor 408A and a temperature-dependent current source transistor 420. The temperature sense resistor 408A is coupled in series with the plurality of temperature-stable resistors 414A, 416A of the process-induced error correction circuit 402.

The logic circuit 402A receives the three-bit process characterization from the process sensor 300 (FIG. 3). In response to the process characterization received from the process sensor, the logic circuit 402A operates the plurality of switches 410A, 412A. By turning individual switches 410A, 412A on or off, the individual resistors 414A, 416A may either be energized or bypassed. As a result, the current flowing in the resistors 414A, 416A, and consequently the current flowing in the temperature sense resistor 408A, may be adjusted to at least partially compensate for variations in the process used to produce the temperature sensor element 404. For example, in one embodiment, in response to the process characterization indicating a slow process, as discussed above, the logic circuit 402A operates to turn switch 410A on and switch 412A off. As a result, the resistors 414A and 416A are bypassed to adjust the current through the temperature sense resistor 408A to at least partially compensate for the slow process. In another example, in response to the process characterization indicating a fast process, as discussed above, the logic circuit 402A operates to turn both switch 410A and switch 412A off. As a result, the resistors 414A and 416A are both energized to adjust the current through the temperature sense resistor 408A to at least partially compensate for the fast process. Thus, the temperature sensor element 404 remains relatively unaffected by variations in the process used to produce the sensor element. It is to be appreciated that the logic circuit 402A, the plurality of switches 410A, 412A, and the resistors 414A, 416A may be configured differently to provide the desired compensation of sensor element 404.

To generate the voltage signal to be digitized by analog-to-digital converter 410 (FIG. 4), the temperature-dependent current source transistor 420 is coupled to the bandgap circuit 106 (FIG. 1) to provide a current proportional to absolute temperature (PTAT) to the temperature sense resistor 408A. Depending on the temperature and the resulting resistance of the temperature sense resistor 408A, the constant current from transistor 420 creates a voltage signal across sense resistor 408A, and, if energized, resistors 414A, 416A. Thus, the voltage signal generated by the temperature sensor element 404 at node 418A varies with temperature.

Further details of the voltage sensor 114 (FIG. 1), according to an embodiment of the present invention, are now described with reference to FIG. 5. The voltage sensor 500 includes a process-induced error correction circuit 502, a voltage sensor element 504, a buffer 506, a constant reference voltage source 508, an analog-to-digital converter 510, a thermometer-to-binary code converter 512, and an optional digital buffer 514, with the output of the digital buffer 514 forming an output 516 of the voltage sensor 500. The voltage sensor element 504 is coupled to the output of the process-induced error correction circuit 502. The buffer 506 is coupled to the output of the voltage sensor element 504. The analog-to-digital converter 510 is coupled to the output of the buffer 506 and the constant reference voltage source 508. The thermometer-to-binary code converter 512 is coupled to the output of the analog-to-digital converter 510. The digital buffer 514 is coupled to the output of the thermometer-to-binary code converter 512.

The process-induced error correction circuit 502 receives the three-bit process characterization from the process sensor 300 (FIG. 3) and operates to compensate the voltage sensor element 504 in response to the process characterization in order to reduce the effects of process variations on the voltage sensor. As will be explained in more detail below, the voltage sensor element 504 detects the power supply voltage level applied to the voltage sensor, and the associated, commonly formed semiconductor device (not shown), and provides a voltage signal, indicative of the power supply voltage level, to the buffer 506. The buffer 506 is configured to buffer the voltage sensor element 504 from the analog-to-digital converter 510 to prevent the load of the analog-to-digital converter 510 from impacting the voltage sensor element 504. In one embodiment, the buffer 506 is an optional component of the voltage sensor 500. The constant reference voltage source 508, such as the voltage reference circuit 104 (FIG. 1), provides a constant reference voltage signal to the analog-to-digital converter 510. Alternatively, the constant reference voltage source 508 may include an LDO regulator separate from that in the voltage reference circuit 104. The analog-to-digital converter 510 compares the voltage signal with the constant reference voltage signal and, responsive to the comparison, provides a thermometer-coded digital signal, indicative of the power supply voltage level, to the thermometer-to-binary code converter 512. The thermometer-to-binary code converter 512 converts the thermometer-coded digital signals into binary-coded digital signals having a smaller number of bits. Finally, the digital buffer 514 provides the binary coded digital signals, indicative of the power supply voltage level of the associated semiconductor device, to the output 516. As discussed above, the indication of the power supply voltage level may include 4 bits.

Further details of the process-induced error correction circuit 502 and the voltage sensor element 504, according to an embodiment of the present invention, are now described with reference to FIG. 5A. The process-induced error correction circuit 502 includes a first plurality of switches 512A, 514A, 516A and a second plurality of switches 506A, 508A, 510A. Each of the first plurality of switches 512A, 514A, 516A is coupled to the output 110 of the voltage reference circuit 104. Individual switches 506A, 508A, 510A are each coupled to one of the three outputs 314, 316, 318 from the process sensor 300 (FIG. 3). For example, in one embodiment, the first switch 506A is coupled to the slow bit 314 of the process sensor 300, the second switch 508A is coupled to the nominal bit 316 of the process sensor 300, and the third switch 508A is coupled to the fast bit 318 of the process sensor 300. The first plurality of switches 512A, 514A, 516A is also coupled to the second plurality of switches 506A, 508A, 510A to form three circuit legs. For example, the first circuit leg may include switches 512A and 506A, the second circuit leg may include switches 514A and 508A, and the third circuit leg may include switches 516A and 510A. The voltage sensor element 504 includes a resistor 518A coupled to each of the first plurality of switches 512A, 514A, 516A, and a node 520A.

The output 110 of the voltage reference circuit 104 (FIG. 1) provides a stable reference voltage to each of the first plurality of switches 512A, 514A, 516A. The second plurality of switches 506A, 508A, 510A is controlled to operate the three legs of the process-induced error correction circuit 502 and compensate the voltage sensor element 504 for variations in the process used to produce the voltage sensor element. However, in one embodiment, only one of the three legs may be energized at any one time. For example, in one embodiment, in response to the process characterization indicating a slow process, the first leg is energized by the slow bit 314 turning on the first switch 506A, the nominal bit 316 turning off the second switch 508A and the fast bit 318 turning off the third switch 510A. In another example, in response to the process characterization indicating a fast process, the third leg is energized by the slow bit 314 turning off the first switch 506A, the nominal bit 316 turning off the second switch 508A and the fast bit 318 turning on the third switch 510A. In a final example, in response to the process characterization indicating a nominal process, the second leg is energized by the slow bit 314 turning off the first switch 506A, the nominal bit 316 turning on the second switch 508A and the fast bit 318 turning off the third switch 510A.

The current flowing in the voltage sensor element 504 varies depending on which leg is energized. In one embodiment, the current flowing in an energized leg, and hence, the current flowing in the voltage sensor element 504, may be dependent on parameters of a device within the energized leg. In one embodiment, the current flowing in the energized leg depends on size characteristics of a switch within the energized leg, such that the current flowing in the energized leg is proportional to a width to length ratio of a switch within the energized leg.

As an example, in one embodiment, each of the switches of the second plurality of switches 506A, 508A 510A has substantially the same size parameters (e.g. a length of 0.6 μm, a width of 10 μm and includes three gate fingers), while each of the switches of the first plurality of switches 512A, 514A, 516A has different size parameters. For example, each of the first, second, and third switches 512A, 514A, and 516A includes four gate fingers and has a length of 2 μm, but the first switch 512A has a width of 4.8 μm, the second switch 514A has a width of 5 μm, and the third switch 516A has a width of 5.2 μm. Therefore, because the drain current of each of the first plurality of switches 512A, 514A, 516A is proportional to its width to length ratio, the current through each one of the legs will also vary. Thus, by energizing one of the three legs in response to the process characterization, the current in the voltage sensor element 504 may be adjusted to compensate for any variations in the process used to produce the voltage sensor element. It is to be appreciated that the operation and size parameters of the switches may be configured differently.

Figure 5A:
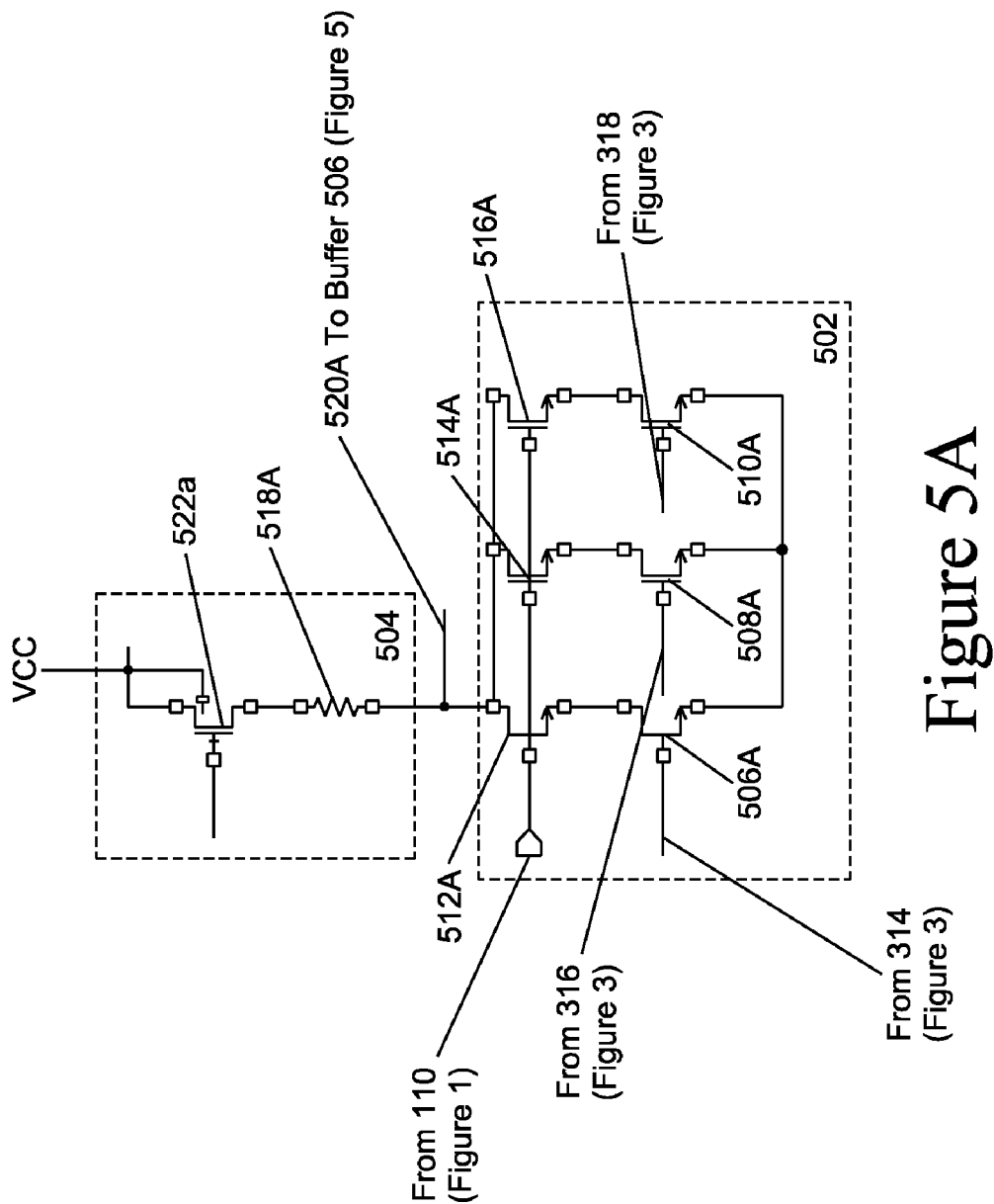
FIG. 5A is a more detailed schematic diagram of a portion of the voltage sensor of FIG. 5.

As shown in FIG. 5A, the voltage sensor element 504 includes a transistor 522A that is coupled in series with temperature-stable resistor 518A. The transistor 522A operates essentially as a saturated switch, and dependent upon which of the three circuit legs is energized, the current flowing through the resistor 518A will vary. The voltage that is dropped across the resistor 518A, which is determined by the resistance of resistor 518A and the current supplied by the process-induced error correction circuit 502, offsets the power supply voltage $V_{cc}$ to produce a process-compensated voltage signal at node 520A that is indicative of the power supply voltage level. Thus, in response to a slow process characterization, the first circuit leg (including switches 512A and 506A) is energized, less voltage is dropped across resistor 518A, and the voltage signal provided at node 520A is offset less than when the third circuit leg (including switches 516A and 510A) is energized based upon a fast process characterization. The process-compensated voltage signal produced at node 520A is provided to Buffer 506 (FIG. 5). As such, the voltage sensor element 504 remains substantially unaffected by variations in the process used to produce the sensor element and variations in temperature.

Figure 6:
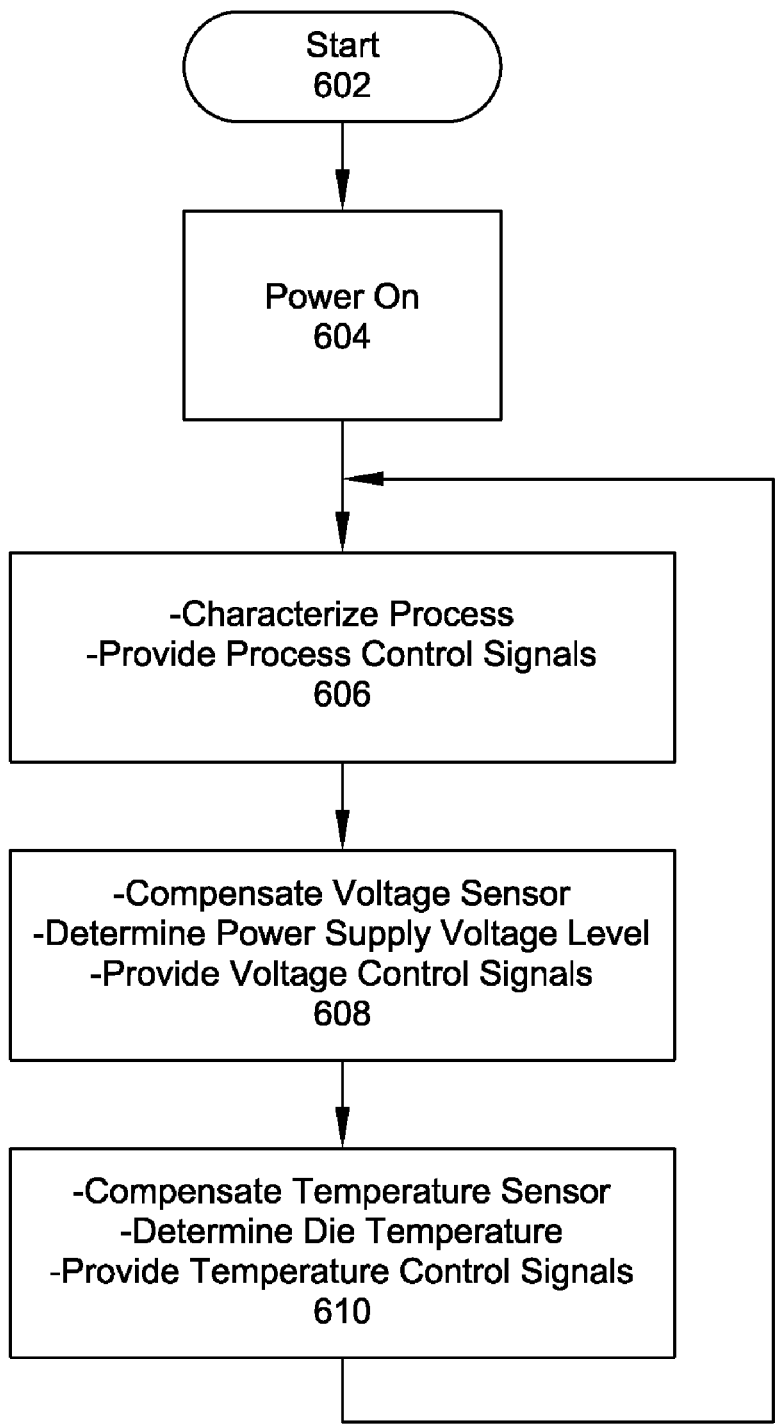
FIG. 6 is a flow diagram of an exemplary method of operation of the process, voltage and temperature sensor of FIG. 1.

FIG. 6 shows a flow chart of a method of operation of the PVT sensor according to an embodiment of the present invention. The method starts at block 602. At block 604, a semiconductor device, including a commonly formed and associated PVT sensor according to an embodiment of the present invention, is powered on. In response to being powered on, at block 606, the PVT sensor characterizes the process by which the process sensor element of the PVT sensor, and thus the associated semiconductor device, was produced. As discussed above, in an embodiment of the present invention, the PVT sensor may characterize the speed of the process sensor element (and the associated, commonly formed semiconductor device). In response to characterizing the process, the PVT sensor provides process control signals indicative of the process by which the PVT sensor (and associated semiconductor device) was produced to the output of the PVT sensor. At block 608, the PVT sensor compensates the voltage sensor in response to the process control signals and determines the power supply voltage level. In response to determining the power supply voltage level, the PVT sensor provides voltage control signals indicative of the power supply voltage level of the PVT sensor and the associated semiconductor device. At block 610, the PVT sensor compensates the temperature sensor in response to the process characterization and determines the die temperature of the temperature sensor of the PVT sensor and the associated semiconductor device. In response to determining the die temperature, the temperature sensor provides temperature control signals indicative of the die temperature of the PVT sensor and associated semiconductor device. In accordance with one embodiment, blocks 606, 608 and 610 may be repeated to continuously and dynamically characterize the process by which the PVT sensor and the associated semiconductor device was produced, sense the power supply voltage level of the PVT sensor and the associated semiconductor device, and sense the die temperature of the PVT sensor and associated semiconductor device. It is to be appreciated that the order in which blocks 608 and 610 are performed may vary. It also is to be appreciated that the process may be characterized dynamically, to account for any process characterization variations (e.g. due to the age of the device) over the lifetime of the associated semiconductor device. In one embodiment, the process characterization is performed each time the associated semiconductor device is powered on.

In accordance with an embodiment of the present invention, the PVT sensor provides control signals which may be used to configure an associated semiconductor device based on sensed process, power supply voltage levels and die temperature levels to provide a more consistent output signal. As discussed above, one example of a semiconductor device which may significantly benefit from a consistent output signal is an upstream PGA of a CATV system.

Figure 7:
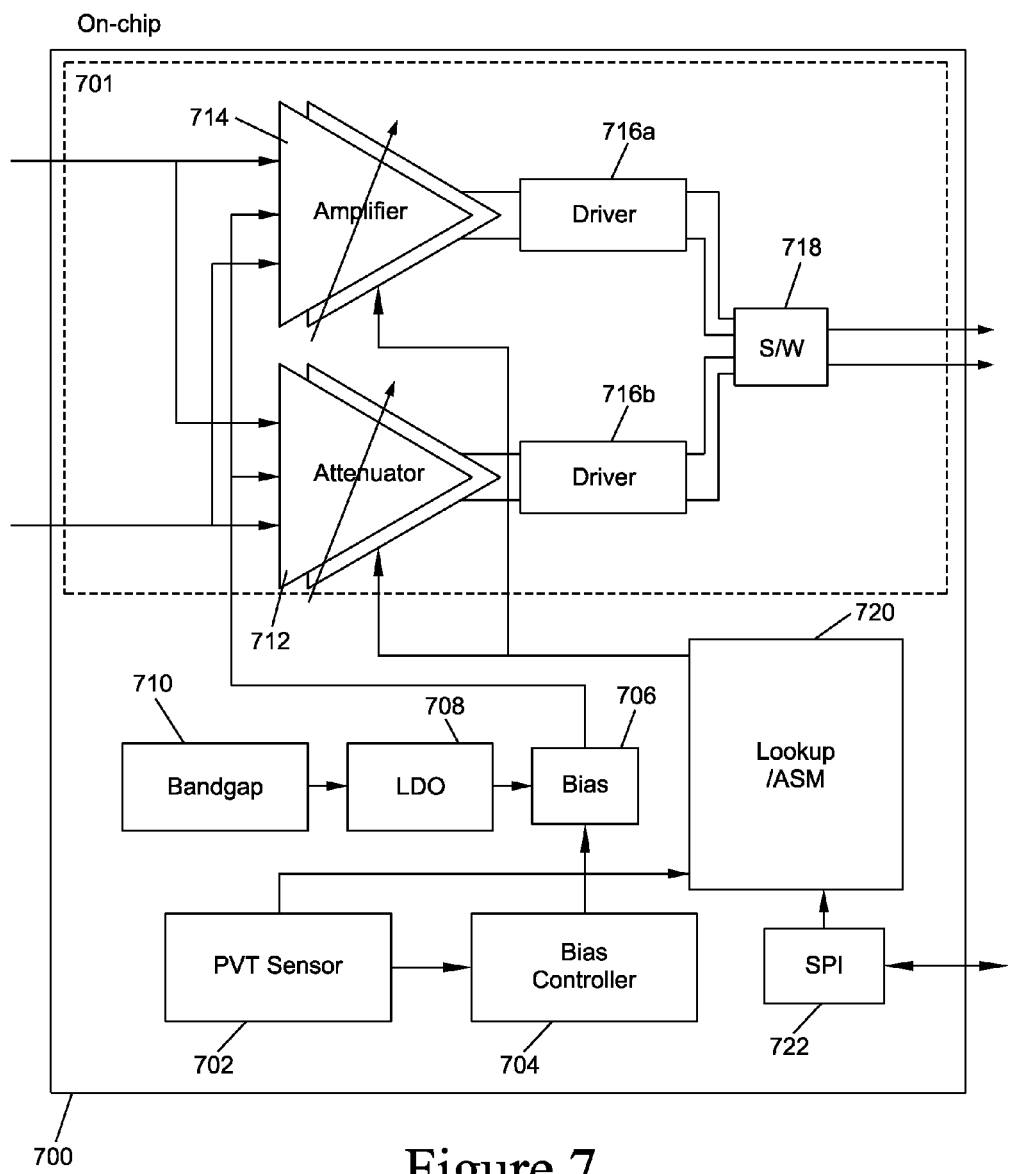
FIG. 7 is a block diagram of an exemplary programmable gain amplifier with on-chip lookup table/state machine according to an embodiment of the present invention.

FIG. 7 is a block diagram of a semiconductor device 700 that includes an integrated PVT sensor in accordance with the present invention. As shown, the semiconductor device includes a PGA 701 and a PVT sensor 702 in accordance with an embodiment of the present invention. The PGA 701 includes a two stage amplifier 714, a two stage attenuator 712, drivers 716a, 716b, and a switch 718. The driver 716a is coupled to the output of the amplifier 714. The driver 716b is coupled to the output of the attenuator 712. The switch 718 is coupled to the outputs of both drivers 716a, 716b.

The semiconductor device 700 also includes a bandgap voltage reference circuit 710, an LDO regulator 708, at least one bias circuit 706, at least one bias controller 704, an on-chip lookup table/state machine 720, and a Serial Peripheral Interface (SPI) 722. The LDO regulator 708 is coupled to the output of the bandgap voltage reference circuit 710. The at least one bias circuit 706 is coupled to the output of the LDO regulator 708, and inputs of the amplifier 714 and the attenuator 712. The at least one bias controller 704 is coupled to an input of the at least one bias circuit 706. The on-chip lookup table/state machine 720 is coupled to gain inputs of the amplifier 714, the attenuator 712 and the output of the PVT sensor 702, and the Serial Peripheral Interface (SPI) 722 is coupled to the on-chip lookup table/state machine 720.

As discussed above, the bandgap voltage reference circuit 710 and the LDO regulator 708 provide a constant reference voltage to the at least one bias circuit 706 and the PVT sensor 702 (connection not shown). Also as discussed above, the PVT sensor 702 characterizes the process used to produce the PVT sensor (and the associated, commonly formed semiconductor device), senses the power supply voltage level of the associated semiconductor device, senses the die temperature of the associated semiconductor device, and provides corresponding control signals.

The control signals are provided to the at least one bias controller 704 which is configured to control the at least one bias circuit 706 in response to the control signals. In one embodiment, the control signals provided by the PVT sensor 702 are also provided to an on-chip lookup table/state machine 720.

The gain and frequency response of the PGA 700 may be controlled with the amplifier 714, the attenuator 712, the drivers 716, the at least one bias circuit 706, and the switch 718. In one example, the amplifier has a DC gain of −1 to 32 dB and the attenuator has a DC gain of −2 to −27 dB.

Figure 8:
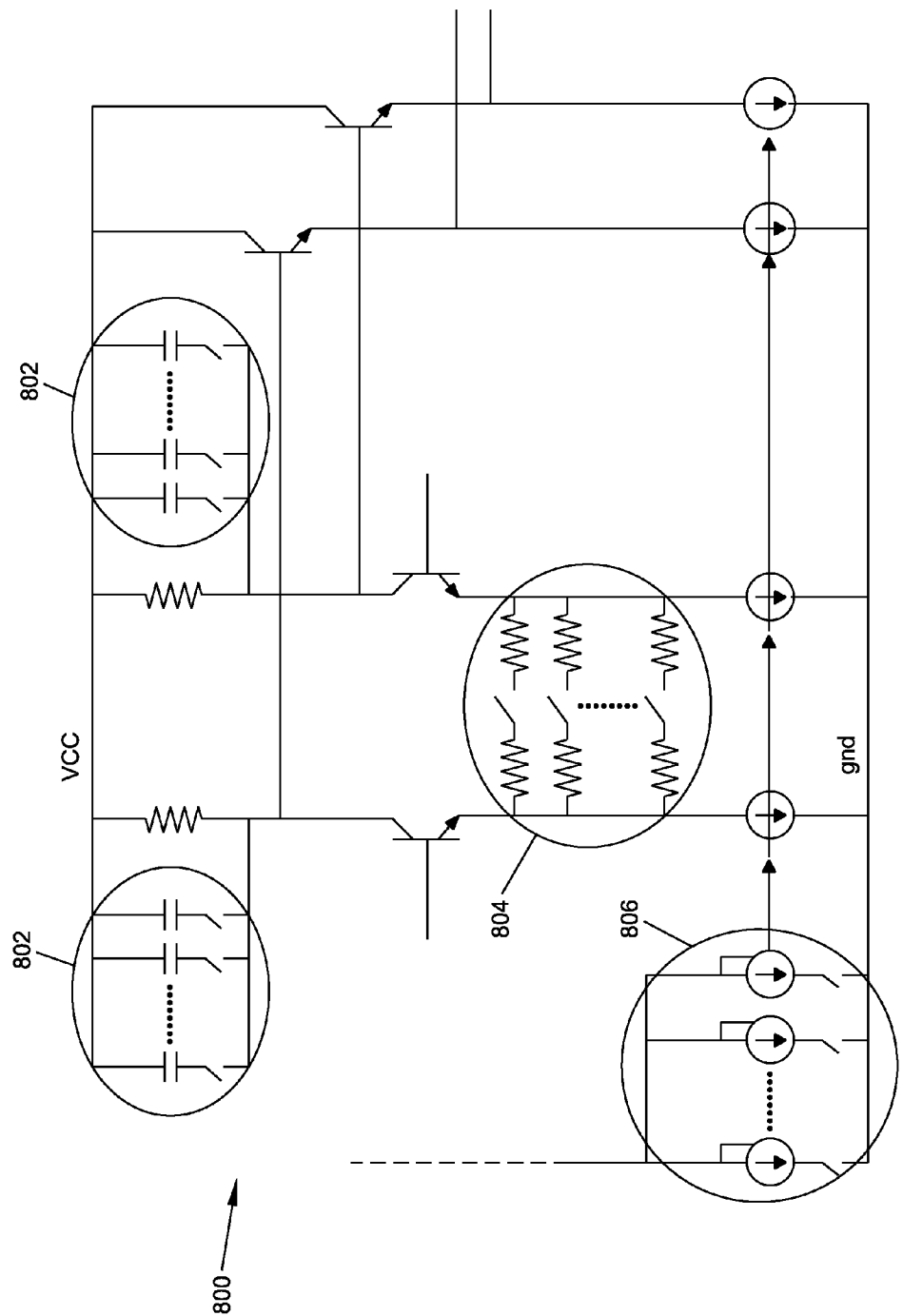
FIG. 8 is a simplified schematic diagram of an amplifier or attenuator in the programmable gain amplifier of FIG. 7.

FIG. 8 shows an embodiment of the first or second stage 800 of the amplifier/attenuator 712/714 and a bias circuit 806. Each stage 800 of the amplifier/attenuator is a common-emitter based amplifier/attenuator with selectable degenerated resistors 804 and selectable frequency compensation capacitors 802. In one embodiment, the first stage has a fine gain step of 0.1 dB while the second stage has a 1 dB gain step. It should be appreciated that the amplifier/attenuator may be configured in more than or less than two stages and the gain steps may be defined differently. The bias circuit 806 includes a plurality of selectable current sources.

Referring to FIGS. 7 and 8, in response to the control signals provided by the PVT sensor 702, the bias controller 704 operates the plurality of selectable current sources of the bias circuit 806 to provide a desired bias current to the amplifier/attenuator stage 800. In one embodiment, only one current source may be selected at any one time.

In addition to receiving control signals from the PVT sensor 702, the lookup table/state machine 720 may also receive a signal including a desired DC gain of the PGA. In one embodiment, the desired DC gain is input to the lookup table/state machine through the SPI 722. However, it should be appreciated that the desired DC gain may be communicated to the lookup table/state machine through other methodologies (e.g. parallel inputs).

In response to the control signals provided by the PVT sensor 702 and to the desired DC gain provided to the lookup table/state machine 720, the on-chip lookup table/state machine 720 controls the DC gain and frequency response of the amplifier 714 and attenuator 712. The lookup table/state machine 720 controls the selectable degenerated resistors 804, selectable frequency compensation capacitors 802 and the switch 718 to adjust the desired DC gain at the output of the PGA 700. In an embodiment of the present invention, the lookup table/state machine 720 includes an Algorithmic State Machine (ASM) capable of controlling the operation of the amplifier 714, attenuator 712 and switch 718 in response to PVT sensor and desired gain inputs.

An embodiment of a portion of the on-chip lookup table of the lookup table/state machine may be seen in FIG. 9. The on-chip lookup table 900 includes a DC gain level index 902, temperature sensor input level indices 904 and process sensor input level indices 906. The on-chip lookup table 900 may also include voltage sensor input level indices (not shown). It should be appreciated that the table illustrated in FIG. 9 shows illustrative inputs and outputs of the on-chip lookup table/state machine. Depending on the desired DC gain and PVT control signals input to the lookup table, the lookup table 900 identifies which resistors of the first stage and the second stage should be switchably set to produce the desired DC gain and the state machine of the lookup table/state machine operates to set the identified resistors. For example, referring to FIG. 9, if the temperature sensor control signal from the PVT is 10001, the process characterization from the PVT is 010 and the desired gain is 111011, the on-chip lookup table/state machine maps the control signals and desired gain to the corresponding indices and operates to close the switch corresponding to resistor 12 of the first stage and resistor 17 of the second stage to maintain the desired 111011 gain. Indices for determining which of selectable frequency compensation capacitors 802 are selected according to the output of the PVT sensor and a desired frequency response of the PGA may be provided in a similar manner.

Figure 10:
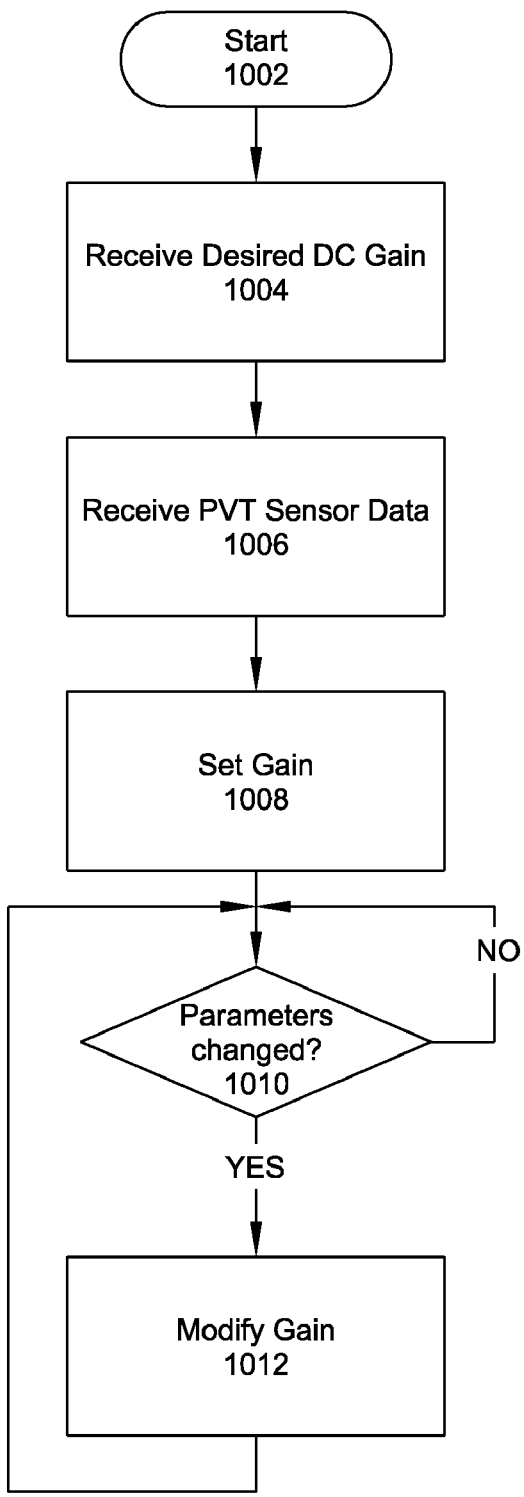
FIG. 10 is a flow chart of an exemplary method of operation of the programmable gain amplifier of FIG. 6.

FIG. 10 shows a flow chart of a method of operation of a PGA with an on-chip lookup table/state machine and PVT sensor according to an embodiment of the present invention. The method starts at block 1002. At block 1004, the on-chip lookup table/state machine receives a desired DC gain provided by a user. At block 1006, the on-chip lookup table/state machine receives the sensor data from the PVT sensor. At block 1008, the on-chip lookup table/state machine configures the PGA, as discussed above, in response to the sensor data from the PVT sensor and the desired DC gain to produce the desired DC gain at the output of the PGA. At block 1010 a determination is made whether any parameters of the PGA (such as desired gain, process characterization, die temperature and/or power supply voltage) have changed. If a determination is made that no parameters have changed, then block 1010 is repeated. If a determination is made that at least one PGA parameter has changed, then at block 1012, the lookup table/state machine modifies the configuration of the PGA, as discussed above, to maintain the desired DC gain. After the PGA is modified at block 1012, block 1010 is repeated. It should be appreciated that modification of the frequency response of the PGA may be performed in an analogous manner.

Figure 11:
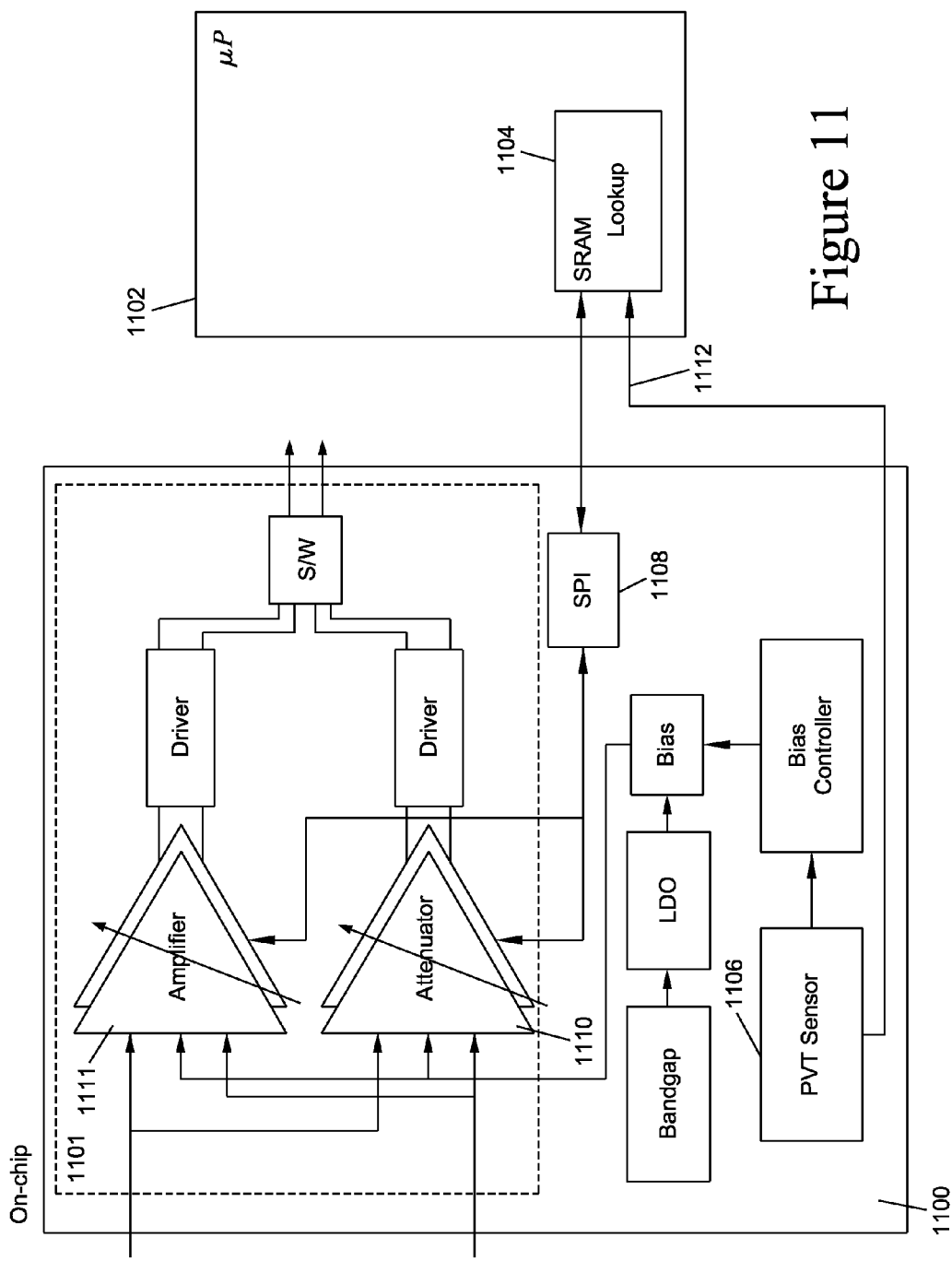
FIG. 11 is a block diagram of an exemplary programmable gain amplifier with an off-chip firmware lookup table and bus interface according to another embodiment of the present invention.

FIG. 11 shows a semiconductor device 1100 including a PGA 1101 and PVT sensor 1106 in accordance with another embodiment of the present invention. The PGA 1101 shown in FIG. 11 is comparable to the PGA 701 shown in FIG. 7, except for the integration of the lookup table/state machine. Unlike the PGA 701 of FIG. 7, the PGA 1101 does not include an on-chip lookup table/state machine. Instead, the PGA 1101 communicates with an off-chip microprocessor 1002 which has downloaded a firmware lookup table 1104. The firmware lookup table 1104 may include the control signal and desired gain indices as discussed above in reference to FIG. 9. In one example, the firmware lookup table is programmed with a circuit description of the PGA (e.g., written in C++) to receive a desired gain setting and the outputs of the PVT sensor and provide a compensated gain setting back to the PGA based thereon. It should be appreciated that the circuit description stored lookup table may be written in any other programming language. In another example, the firmware lookup table is stored in one of SRAM, EEPROM or Flash memory of the microprocessor; however, it should be appreciated that the firmware lookup table may be stored in any type of computer memory. The microprocessor 1102 may be located on the same Printed Circuit Board (PCB) (not shown) as the PGA 1101.

The microprocessor 1102 is programmed to control the gain and frequency response of the PGA 1101. The PVT sensor 1106 characterizes the process used to produce the PVT sensor (and the associated semiconductor device), senses the power supply voltage level of the associated semiconductor device, senses the die temperature of the associated semiconductor device, and provides corresponding P, V, T sensor signals to the microprocessor 1002 over a bus 1112. The microprocessor 1102 receives the P, V, T sensor signals from the PVT sensor 1106 and maps the sensor signals and the desired gain, provided by the user, to the corresponding indices in the downloaded firmware lookup table 1104 to provide a compensated gain signal to the PGA 1101 to compensate for sensed parameters. In one embodiment, the compensated gain signal is transmitted to the PGA 1101 via the SPI 1108 and is configured to control the operation of the amplifier 1111 and attenuator 1110 as discussed above. By storing the firmware lookup table on a separate microprocessor 1102, the die area of the PGA 1101 may be reduced and the firmware lookup table 1104 may be updated easily by downloading an updated version of the firmware lookup table.

Figure 12:
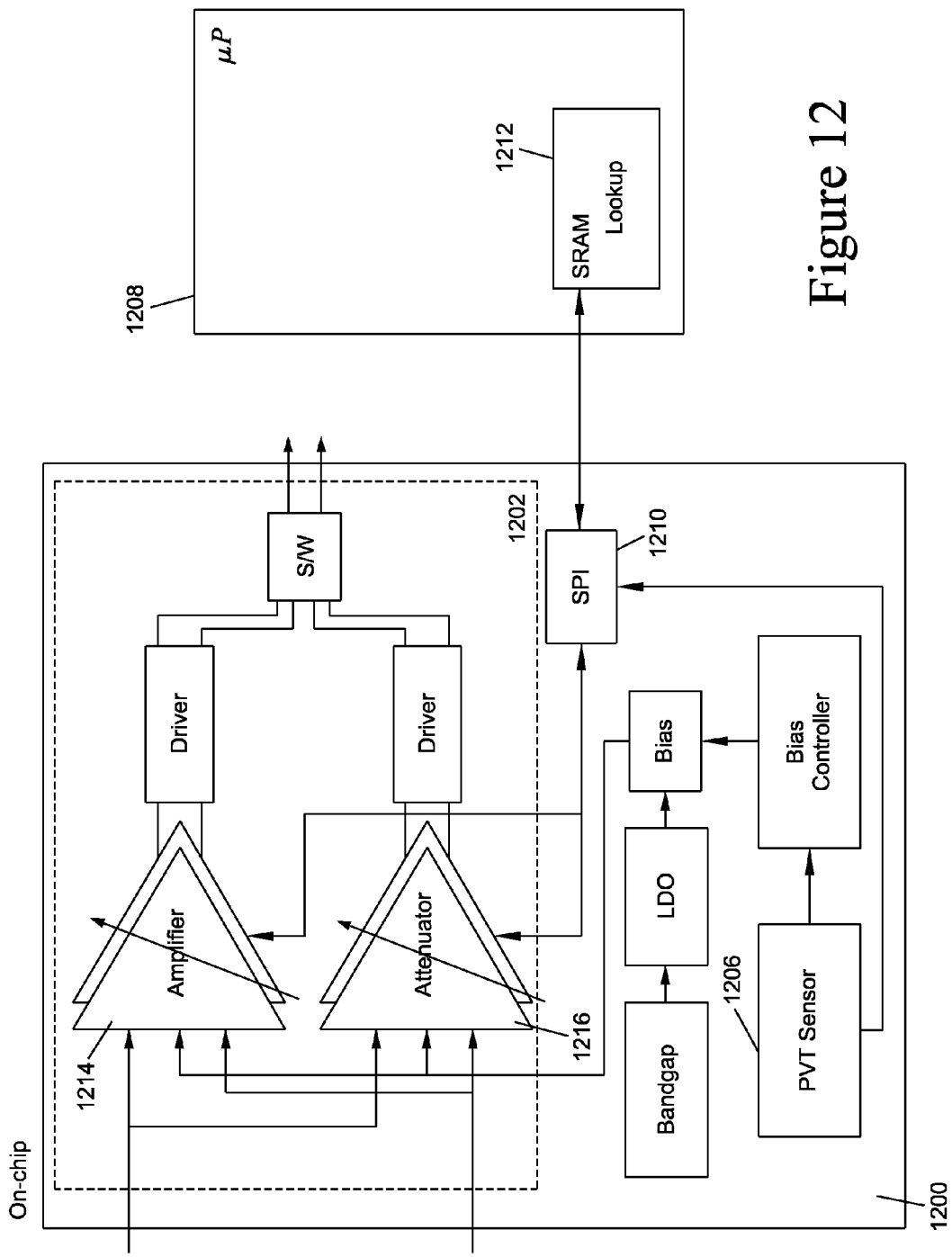
FIG. 12 is a block diagram of a programmable gain amplifier with an off-chip firmware lookup table according to another embodiment of the present invention.

FIG. 12 shows a semiconductor device 1200 including a PGA 1202 and a PVT sensor 1206 in accordance with another embodiment of the present invention. The PGA 1202 of FIG. 12 is comparable to the PGA 1101 of FIG. 11 except for the configuration of the connection between the PVT sensor 1206 and the microprocessor 1208. Unlike the PGA 1101 of FIG. 11, the PGA 1202 of FIG. 12 does not include a separate bus connecting the PVT sensor 1206 to the microprocessor 1208. Instead, the PVT sensor 1206 provides P, V, T sensor signals to the SPI 1210 and the SPI 1210 communicates the sensor signals from the PVT sensor 1206 to the microprocessor 1208.

The microprocessor 1208 is programmed to control the gain and frequency response of the PGA 1202. The PVT sensor 1206 characterizes the process used to produce the PVT sensor (and the associated semiconductor device), senses the power supply voltage level of the associated semiconductor device, senses the die temperature of the associated semiconductor device, and provides corresponding P, V, T sensor signals to the SPI 1210. The microprocessor 1208 receives the P, V, T sensor signals from the SPI 1210 and maps the sensor signals and the desired gain, provided by the user, to the corresponding indices in the downloaded firmware lookup table 1212 to provide a compensated gain signal to the PGA 1202 to compensate for sensed parameters. In one embodiment, the compensated gain signal is transmitted to the PGA 1200 via the SPI 1210 and is configured to control the operation of the amplifier 1214 and attenuator 1216 as discussed above. In utilizing the SPI 1210 to interface the PVT sensor 1206 and the microprocessor 1208, a reduced PCB area or simplified PCB routing scheme may be used. It should be appreciated that even though the connection between the PVT sensor 1206 and the microprocessor 1208 is different than in FIG. 7 or 11, the format of the control signal and desired gain indices may be the same as described in reference to FIG. 9.

Figure 13:
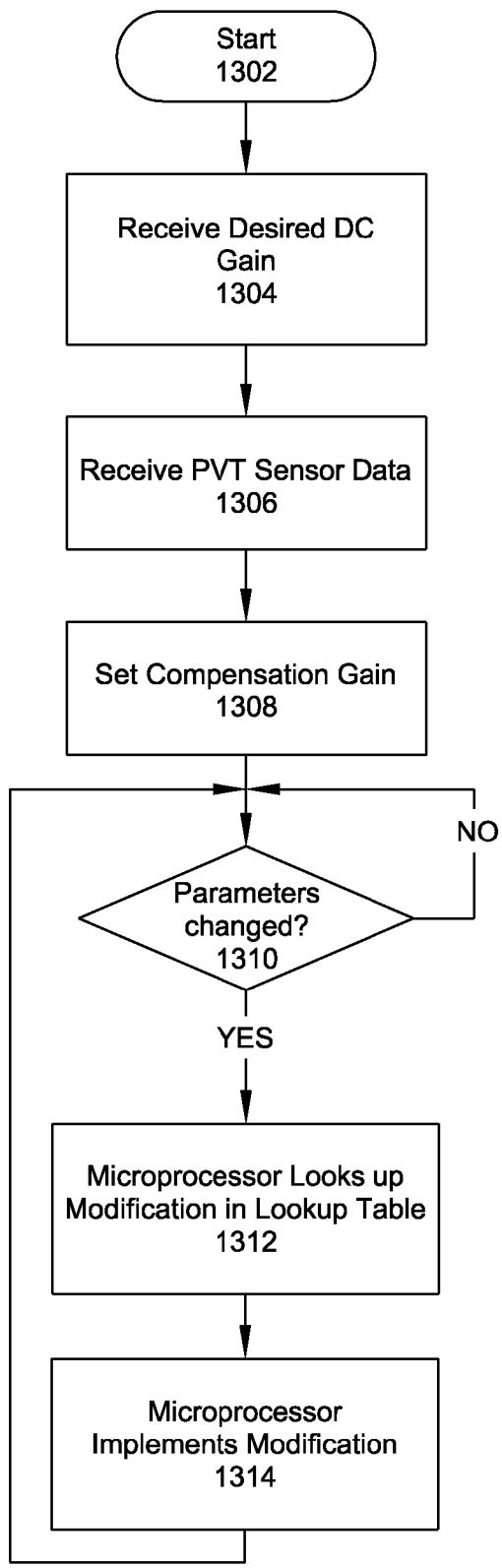
FIG. 13 is a flow chart of a method of operation of the programmable gain amplifiers of FIGS. 11 and 12.

FIG. 13 shows a flow chart of a method of operation of a PGA with an off-chip firmware lookup table and PVT sensor according to an embodiment of the present invention. The method starts at block 1302. At block 1304, the off-chip firmware lookup table receives a desired DC gain provided by a user. At block 1306, the off-chip firmware lookup table receives the sensor data from the PVT sensor. At block 1308, the microprocessor configures the PGA, as discussed above, in response to the sensor data from the PVT sensor and the desired DC gain provided by the user to produce the desired DC gain at the output of the PGA. At block 1310 a determination is made whether any parameters of the PGA (such as desired gain, process characterization, die temperature or power supply voltage) have changed. In response to a determination that no parameters have changed, block 1310 is repeated. Alternatively, in response to a determination that at least one PGA parameter has changed, at block 1312, the microprocessor looks up a corresponding modification in the firmware lookup table. At block 1314, in response to the corresponding modification found in the firmware lookup table, the microprocessor configures the PGA 1202 by providing a compensated gain setting to the PGA to counteract the changed parameter, as discussed above, and maintain a desired DC gain. It should be appreciated that modification of the frequency response of the PGA may be performed in an analogous manner.

It should be appreciated that even though the PVT sensor of the present invention has been described in relation to a PGA of a CATV system, the PVT sensor may also be used with any device that is sensitive to temperature, voltage or process variations and in which a stable output is desired. For example, the PVT sensor may be used with digital logic circuits to adjust input or output buffer impedances, or to improve the stability of integrated oscillator and improve the uniformity of integrated circuit oscillator performance from oscillator chip-to-oscillator chip.

In accordance with the present invention, disadvantages associated with sensitive semiconductor devices, such as inconsistency, are reduced by providing a sensor that is capable of sensing the voltage level and the temperature at which a device is operated, sensing parameters indicative of the process by which the device was produced to characterize the performance of the device, and providing sensor signals which may be used to compensate the device to ensure more consistent performance.

As discussed above, embodiments of the present invention are directed to a Process, Voltage and Temperature (PVT) sensor configured to sense process parameters indicative of the process by which an associated, commonly formed device was produced, the power supply voltage level at which the associated device is operated, and the temperature at which the associated device is operated. It should be appreciated that in one embodiment the PVT sensor is implemented on the same integrated circuit as the associated device and formed by the same processing steps, such that the parameters sensed by the PVT sensor accurately reflect those of the associated device. However, in another embodiment, the PVT sensor and the associated device may be implemented on separate integrated circuits that are in relative proximity to each other (e.g. attached to the same substrate). Where the PVT sensor is implemented on a separate integrated circuit from the associated device, but in close physical proximity to one another (e.g., on the same substrate), and power is provided by the same voltage supply, the PVT sensor may be used to provide a process-compensated temperature signal and supply voltage signal that accurately reflects the temperature and supply voltage of the associated semiconductor device.

In accordance with one embodiment, the sensed process parameters indicative of the process by which the PVT sensor and the associated, commonly formed semiconductor device was produced are used to qualitatively characterize the performance of the associated device, and output signals indicative of the performance of the PVT sensor and the associated device, the sensed operating power supply voltage level of the PVT sensor and the associated device, and the sensed operating temperature of the PVT sensor and the associated device are provided. These output signals may be used to configure the associated device to compensate the associated device to provide a more consistent output, despite performance differences between different chips of the same design and manufacture, and despite differences in the conditions in which the device is operated. In one embodiment, at least a portion of the associated device is programmable and the portion is programmed in response to the output signals to compensate the associated device to provide a consistent output. In another embodiment, a device that is operationally downstream from the associated device can be configured in response to the output signals to compensate for performance differences in the associated device.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. An integrated circuit, comprising:
   a process sensor configured to sense a process parameter indicative of a semiconductor process by which the integrated circuit is formed and, based upon the sensed process parameter, to provide a characterization of the semiconductor process to an output of the process sensor;
   a temperature sensor configured to provide an indication of a temperature of the integrated circuit to an output of the temperature sensor; and
   a voltage sensor configured to provide an indication of a power supply voltage level of the integrated circuit to an output of the voltage sensor;
   wherein the output of the process sensor is electrically coupled to at least one of the temperature sensor and the voltage sensor to compensate at least one of the indication of the temperature and the indication of the power supply voltage level in response to the characterization of the semiconductor process.

2. The integrated circuit of claim 1, wherein the output of the process sensor is electrically coupled to both the temperature sensor and the voltage sensor to compensate both the indication of the temperature and the indication of the power supply voltage level in response to the characterization of the semiconductor process.

3. The integrated circuit of claim 2, wherein the process sensor provides the characterization of the semiconductor process each time the process sensor is powered on.

4. The integrated circuit of claim 1, wherein the temperature sensor is configured to dynamically provide the indication of the temperature of the integrated circuit to the output of the temperature sensor, and wherein the voltage sensor is configured to dynamically provide the indication of the power supply voltage level of the integrated circuit to the output of the voltage sensor.

5. The integrated circuit of claim 4, wherein the integrated circuit includes an associated semiconductor device that is commonly formed with the process sensor, the temperature sensor, and the voltage sensor using the same semiconductor process fabrication steps.

6. The integrated circuit of claim 5, wherein the associated semiconductor device is programmable.

7. The integrated circuit of claim 6, wherein the associated semiconductor device is compensated in response to the characterization of the semiconductor process provided by the process sensor, the indication of the temperature provided by the temperature sensor, and the indication of the power supply voltage level provided by the voltage sensor.

8. The integrated circuit of claim 7, further comprising an algorithmic state machine, the algorithmic state machine being electrically coupled to the output of the process sensor, the output of the temperature sensor, the output of the voltage sensor, and a programmable input of the associated semiconductor device, the algorithmic state machine being configured to compensate the associated semiconductor device in response to the characterization of the semiconductor process provided by the process sensor, the indication of the temperature provided by the temperature sensor, and the indication of the power supply voltage level provided by the voltage sensor.

9. The integrated circuit of claim 8, wherein the associated semiconductor device includes a programmable gain amplifier, wherein the algorithmic state machine includes an input to receive an operational setting indicative of at least one of a gain and a frequency response of the programmable gain amplifier, and wherein the algorithmic state machine is configured to compensate the programmable gain amplifier in response to the characterization of the semiconductor process provided by the process sensor, the indication of the temperature provided by the temperature sensor, and the indication of the power supply voltage level provided by the voltage sensor according to the operational setting.

10. The integrated circuit of claim 7, further comprising at least one interface electrically coupled to the output of the process sensor, the output of the temperature sensor, the output of the voltage sensor, and a programmable input of the associated semiconductor device, the interface being configured to provide the characterization of the semiconductor process provided by the process sensor, the indication of the temperature provided by the temperature sensor, and the indication of the power supply voltage level provided by the voltage sensor to an external device, and to receive from the external device a compensated operational setting to provide to the programmable input of the associated semiconductor device.

11. The integrated circuit of claim 5, wherein the associated semiconductor device has an output to provide an output signal, the integrated circuit further comprising:

at least one interface electrically coupled to the output of the process sensor, the output of the temperature sensor, and the output of the voltage sensor, the at least one interface being configured to provide the characterization of the semiconductor process provided by the process sensor, the indication of the temperature provided by the temperature sensor, and the indication of the power supply voltage level provided by the voltage sensor to an external device to allow the external device to compensate the output signal of the associated semiconductor device based upon the characterization of the semiconductor process, the indication of the temperature, and the indication of the power supply voltage level.

* * * * *